United States Patent
Hsiao

(10) Patent No.: US 10,474,386 B1
(45) Date of Patent: Nov. 12, 2019

(54) MEMORY MANAGEMENT METHOD AND STORAGE CONTROLLER

(71) Applicant: Shenzhen EpoStar Electronics Limited CO., Shenzhen (CN)

(72) Inventor: Yu-Hua Hsiao, Hsinchu County (TW)

(73) Assignee: Shenzhen EpoStar Electronics Limited CO., Shenzhen (CN)

( * ) Notice: Subject to any disclaimer, the term of this patent is extended or adjusted under 35 U.S.C. 154(b) by 0 days.

(21) Appl. No.: 16/125,774

(22) Filed: Sep. 10, 2018

(30) Foreign Application Priority Data

Jul. 6, 2018 (TW) .............................. 107123575 A

(51) Int. Cl.
| | |
|---|---|
| G06F 3/00 | (2006.01) |
| G06F 3/06 | (2006.01) |
| G11C 16/04 | (2006.01) |
| G11C 11/56 | (2006.01) |
| G11C 16/26 | (2006.01) |
| G11C 16/10 | (2006.01) |

(52) U.S. Cl.
CPC .......... *G06F 3/0644* (2013.01); *G06F 3/0604* (2013.01); *G06F 3/0632* (2013.01); *G06F 3/0679* (2013.01); *G11C 11/5621* (2013.01); *G11C 11/5671* (2013.01); *G11C 16/0483* (2013.01); *G11C 16/10* (2013.01); *G11C 16/26* (2013.01)

(58) Field of Classification Search
CPC ........................ G06F 3/0644; G11C 11/5621
USPC ........................................................ 711/103
See application file for complete search history.

(56) References Cited

U.S. PATENT DOCUMENTS

| | | | | |
|---|---|---|---|---|
| 7,656,707 | B2* | 2/2010 | Kozlov | .............. G06F 11/1072 365/154 |
| 9,047,974 | B2 | 6/2015 | Huang et al. | |
| 2007/0168625 | A1* | 7/2007 | Cornwell | ............ G06F 12/0607 711/157 |
| 2010/0103738 | A1 | 4/2010 | Chen et al. | |
| 2016/0141041 | A1 | 5/2016 | Yang et al. | |

FOREIGN PATENT DOCUMENTS

WO        2006065655        6/2006

OTHER PUBLICATIONS

"Office Action of Taiwan Counterpart Application," dated Mar. 29, 2019, p. 1-p. 3.

* cited by examiner

*Primary Examiner* — Jae U Yu
(74) *Attorney, Agent, or Firm* — JCIPRNET

(57) ABSTRACT

A memory management method is provided. The method includes selecting a target physical programming unit among a plurality of physical programming units of a rewritable non-volatile memory module; identifying a target storage status and a target read voltage according to a memory type of the rewritable non-volatile memory module; using the target read voltage to read the target physical programming unit to obtain a bit value ratio; and identifying a storage pattern of the target physical programming unit according to the bit value ratio.

10 Claims, 13 Drawing Sheets

Relationship between the bit value ratios and the storage patterns

| | SLC | MLC | TLC | QLC | |
|---|---|---|---|---|---|
| Blank | 100%~(100-x)% | 100%~(100-x)% | 100%~(100-x)% | 100%~(100-x)% | |
| First type storage pattern (M=1) | $(100/2^M)\% \pm a\%$ | $(100/2^M)\% \pm a\%$ | $(100/2^M)\% \pm a\%$ | $(100/2^M)\% \pm a\%$ | 50% ± a% |
| Second type storage pattern (M=2) | | $(100/2^M)\% \pm b\%$ | $(100/2^M)\% \pm b\%$ | $(100/2^M)\% \pm b\%$ | 25% ± b% |
| Third type storage pattern (M=3) | | | $(100/2^M)\% \pm c\%$ | $(100/2^M)\% \pm c\%$ | 12.5% ± c% |
| Fourth type storage pattern (M=4) | | | | $(100/2^M)\% \pm d\%$ | 6.25% ± d% | a, b, c, d: Positive value    x: 0 or Positive value

FIG. 6

MEMORY MANAGEMENT METHOD AND STORAGE CONTROLLER

CROSS-REFERENCE TO RELATED APPLICATION

This application claims the priority benefit of Taiwan application serial no. 107123575, filed on Jul. 6, 2018. The entirety of the above-mentioned patent application is hereby incorporated by reference herein and made a part of this specification.

BACKGROUND

Technology Field

The disclosure relates to a memory management method, and more particularly, to a memory management method and a storage controller adapted to a storage device having a rewritable non-volatile memory module.

Description of Related Art

For a storage device disposed with a rewritable non-volatile memory module, it is an important process to determine/identify existence and position of a blank page (a blank storage unit). The reason is that, a storage controller of the storage device needs to identify whether one storage unit is blank in order to securely manage available storage space or to assign/manage unused storage space. In addition, if used storage units can be accurately identified, it can also help the storage unit to maintain stored data.

In general, when the storage controller intends to determine whether one particular storage unit is blank, the storage controller would read that particular storage unit, so as to determine whether that particular storage unit is blank according to whether a number of bit values read being "1" is greater than a predetermined value. However, after the stored data has been stored for a long time, the traditional approach described above would lead to misjudgment on the blank storage unit. As a worst case scenario, the storage unit determined as blank may actually be stored with data, which then leads to data loss or difficulties in managing and identifying the storage space.

In addition, when a memory type of the rewritable non-volatile memory module is a memory type that allows one memory cell to store a plurality of bit values such as the MLC, as the traditional approach, the storage controller also needs to perform many reading operations on physical pages (e.g., an upper and a lower physical pages) of the storage unit corresponding to each bit value to determine whether the storage unit is blank, so as to determine a storage pattern of the storage unit (the storage pattern may be "blank", "only the upper physical is blank", "both the upper physical page and the lower physical page are non-blank", etc.), thereby increasing a read count as well as the possibility of errors.

Therefore, finding a way to determine the storage pattern of the storage unit quickly, simply and accurately and thereby improve a storage space management efficiency for the rewritable non-volatile memory module is a subject of research in the field.

Nothing herein should be construed as an admission of knowledge in the prior art of any portion of the present invention. Furthermore, citation or identification of any document in this application is not an admission that such document is available as prior art to the disclosure, or that any reference forms a part of the common general knowledge in the art.

SUMMARY

The disclosure is directed to a memory management method (a.k.a. a storage pattern management method) and a storage controller, which are capable of rapidly and accurately identifying a storage pattern of a storage unit, thereby increasing a management efficiency of the storage device on the storage space.

An embodiment of the disclosure provides a memory management unit method adapted to a storage device having a rewritable non-volatile memory module. The rewritable non-volatile memory module has a plurality of physical programming units, and each physical programming unit among the physical programming units has a plurality of memory cells. The method includes selecting a target physical programming unit among the physical programming units, wherein the target physical programming unit has a plurality of first memory cells; identifying a target storage status according to a memory type of the rewritable non-volatile memory module, and obtaining a target read voltage according to the target storage status and a preset read voltage corresponding to the target storage status; using the target read voltage to read the target physical programming unit so as to identify a plurality of second memory cells among the first memory cells, wherein a storage status of the second memory cells is the target storage status, wherein a threshold voltage distribution of the plurality of second memory cells is lower than a threshold voltage distribution of a plurality of third memory cells among a plurality of first memory cells, wherein a storage status of the third memory cells is different from the target storage status; calculating a bit value ratio according to the plurality of second memory cells; and identifying a storage pattern of the target physical programming unit according to the bit value ratio.

An embodiment of the disclosure provides a storage controller, which is configured to control a storage device having a rewritable non-volatile memory module. The storage controller includes a connection interface circuit, a memory interface control circuit, a storage controller and a processor. The connection interface circuit is configured to couple to a host system. The memory interface control circuit is configured to couple to the rewritable non-volatile memory module. The rewritable non-volatile memory module has a plurality of physical programming units, and each physical programming unit among the physical programming units has a plurality of memory cells. The processor is coupled to the connection interface circuit, the memory interface control circuit and a storage status management circuit unit. The processor selects a target physical programming unit among the physical programming units and instructs the storage status management circuit unit to perform a storage status identifying operation on the target physical programming unit, wherein the target physical programming unit has a plurality of first memory cells. In the storage status identifying operation, the storage status management circuit unit is configured to identify a target storage status according to a memory type of the rewritable non-volatile memory module and obtain a target read voltage according to the target storage status and a preset read voltage corresponding to the target storage status; the storage status management circuit unit is further configured to use the target read voltage to read the target physical programming unit so as to identify a plurality of second memory cells among the first memory cells, wherein a storage status of the second memory cells is the target storage status, wherein a threshold voltage distribution of a plurality of second memory cells is lower than a threshold voltage distribution of a plurality of third memory cells among a plurality of first memory cells, wherein a storage status of the third memory cells is different from the target storage status; the storage status management circuit unit is further configured to calculate a bit value ratio according to the second memory cells; and the storage status management circuit unit is further configured to identify a storage pattern of the target physical programming unit according to the bit value ratio.

Based on the above, the memory management method and the storage controller provided by the disclosure can identify the target storage status of the corresponding target read voltage according to the memory type of the rewritable non-volatile memory module, and directly identify the storage pattern of the target physical programming unit through the bit value ratio obtained by using the target read voltage, so as to improve efficiency and accuracy for identifying the storage pattern of the target physical programming unit and thereby improve efficiency of the storage device for managing the used space and the unused space.

To make the above features and advantages of the disclosure more comprehensible, several embodiments accompanied with drawings are described in detail as follows.

It should be understood, however, that this summary may not contain all of the aspects and embodiments of the disclosure, is not meant to be limiting or restrictive in any manner, and that the disclosure herein is and will be understood by those of ordinary skill in the art to encompass obvious improvements and modifications thereto.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIG. 6 is a schematic diagram illustrating a relationship between a bit value ratio and a storage pattern according to an embodiment of the disclosure.

DESCRIPTION OF THE EMBODIMENTS

Figure 1:
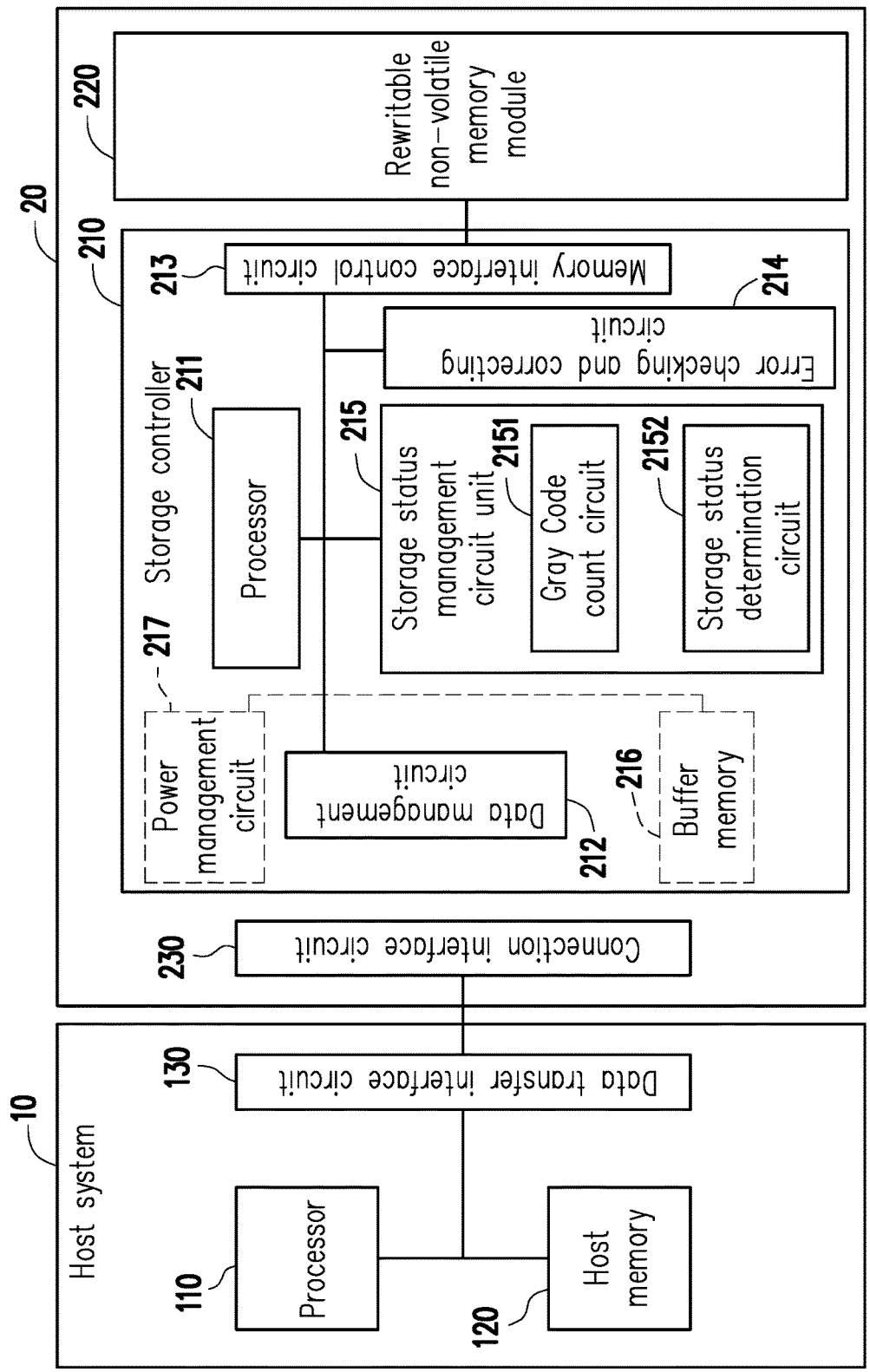
FIG. 1 is a block diagram illustrating a host system and a storage device according to an embodiment of the disclosure.

Reference will now be made in detail to the preferred embodiments of the disclosure, examples of which are illustrated in the accompanying drawings. Wherever possible, the same reference numbers are used in the drawings and the description to refer to the same or like parts.

Embodiments of the disclosure may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

In the embodiment, a storage device includes a rewritable non-volatile memory module and a storage device controller (a.k.a. a storage controller or a storage control circuit). Also, the storage device is usually used together with a host system so the host system can write data into or read data from the storage device.

FIG. 1 is a block diagram illustrating a host system and a storage device according to an embodiment of the disclosure.

With reference to FIG. 1, a host system 10 includes a processor 110, a host memory 120 and a data transfer interface circuit 130. In this embodiment, the data transfer interface circuit 130 is coupled to (or, electrically connected to) the processor 110 and the host memory 120. In another embodiment, the processor 110, the host memory 120 and the data transfer interface circuit 130 are coupled to one another by utilizing a system bus.

A storage device 20 includes a storage controller 210, a rewritable non-volatile memory module 220 and a connection interface circuit 230. Among them, the storage controller 210 includes a processor 211, a data management circuit 212 and a memory interface control circuit 213.

In this embodiment, the host system 10 is coupled to the storage device 20 through the data transfer interface circuit 130 and the connection interface circuit 230 of the storage device 20 to perform a data accessing operation. For example, the host system 10 can store data to the storage device 20 or read data from the storage device 20 through the data transfer interface circuit 130.

In the embodiment, the processor 110, the host memory 120 and the data transfer interface circuit 130 may be disposed on a main board of the host system 10. The number of the data transfer interface circuit 130 may be one or more. Through the data transfer interface circuit 130, the main board may be coupled to the storage device 20 in a wired manner or a wireless manner. The storage device 20 may be, for example, a flash drive, a memory card, a solid state drive (SSD) or a wireless memory storage device. The wireless memory storage device may be, for example, a memory storage device based on various wireless communication technologies, such as an NFC (Near Field Communication) memory storage device, a WiFi (Wireless Fidelity) memory storage device, a Bluetooth memory storage device, a BLE (Bluetooth low energy) memory storage device (e.g., iBeacon). Further, the main board may also be coupled to various I/O devices including a GPS (Global Positioning System) module, a network interface card, a wireless transmission device, a keyboard, a monitor and a speaker through the system bus.

In this embodiment, the data transfer interface circuit 130 and the connection interface circuit 230 are an interface circuit compatible with a Peripheral Component Interconnect Express (PCI Express) interface standard. Further, a data transfer is performed between the data transfer interface circuit 130 and the connection interface circuit 230 by using a communication protocol of a Non-Volatile Memory express (NVMe) interface standard.

Nevertheless, it should be understood that the disclosure is not limited to the above. The data transfer interface circuit 130 and the connection interface circuit 230 may also be compatible to a PATA (Parallel Advanced Technology Attachment) standard, an IEEE (Institute of Electrical and Electronic Engineers) 1394 standard, a USB (Universal Serial Bus) standard, a SD interface standard, a UHS-I (Ultra High Speed-I) interface standard, a UHS-II (Ultra High Speed-II) interface standard, a MS (Memory Stick) interface standard, a Multi-Chip Package interface standard, a MMC (Multi Media Card) interface standard, an eMMC interface standard, a UFS (Universal Flash Storage) interface standard, an eMCP interface standard, a CF interface standard, an IDE (Integrated Device Electronics) interface standard or other suitable standards. Further, in another embodiment, the connection interface circuit 230 and the storage controller 210 may be packaged into one chip, or the connection interface circuit 230 is distributed outside a chip containing the storage controller 210.

In this embodiment, the host memory 120 is configured to temporarily store commands or data executed by the processor 110. For instance, in this exemplary embodiment, the host memory 120 may be a DRAM (Dynamic Random Access Memory), or a SRAM (Static Random Access Memory) and the like. Nevertheless, it should be understood that the disclosure is not limited in this regard, and the host memory 120 may also be other appropriate memories.

The storage unit 210 is configured to execute a plurality of logic gates or control commands, which are implemented in a hardware form or in a firmware form, and to perform operations of writing, reading or erasing data in the rewritable non-volatile memory storage module 220 according to the commands of the host system 10.

More specifically, the processor 211 in the storage controller 210 is a hardware with computing capabilities, which is configured to control overall operation of the storage controller 210. Specifically, the processor 211 has a plurality of control commands and the control commands are executed to perform various operations such as writing, reading and erasing data during operation of the storage device 20.

It should be noted that, in the embodiment, the processor 110 and the processor 211 are, for example, a central processing unit (CPU), a micro-processor, other programmable microprocessors, a digital signal processor (DSP), a programmable controller, an application specific integrated circuits (ASIC), a programmable logic device (PLD) or other similar circuit elements. The disclosure is not limited in this regard.

In an embodiment, the storage controller 210 further includes a ROM (not illustrated) and a RAM (not illustrated). More particularly, the ROM has a boot code, which is executed by the processor 221 to load the control commands stored in the rewritable non-volatile memory module 220 into the RAM of the storage controller 210 when the storage controller 210 is enabled. Then, the control commands are executed by the processor 211 to perform operations, such as writing, reading or erasing data. In another embodiment, the control commands of the processor 211 may also be stored as program codes in a specific area (for example, physical storage units in the rewritable non-volatile memory module 220 dedicated for storing system data) of the rewritable non-volatile memory module 220.

In this embodiment, as described above, the storage controller 210 further includes the data management circuit 212, the memory interface control circuit 213, an error checking and correcting circuit 214 and a storage status management circuit unit 215. It should be noted that, operations performed by each part of the storage controller 210 may also be considered as operations performed by the storage controller 210.

The data management circuit 212 is coupled to the processor 211, the memory interface control circuit 213 and the connection interface circuit 230. The data management circuit 212 is configured to transmit data under instruction of the processor 211. For example, the data may be read from the host system 10 (e.g., the host memory 120) through the connection interface circuit 230, and the read data may be written into the rewritable non-volatile memory module 220 through the memory interface control circuit 213 (e.g., a writing operation performed according to the write command from the host system 10). As another example, the data may be read from one or more physical units of the rewritable non-volatile memory module 220 through the memory interface control circuit 213 (the data may be read from one or more memory cells in one or more physical units), and the read data may be written into the host system 10 (e.g., the host memory 120) through the connection interface circuit 230 (e.g., a reading operation performed according to a read command from the host system 10). In another embodiment, the data management circuit 212 may also be integrated into the processor 211.

The memory interface control circuit 213 is configured to perform writing (a.k.a. programming) operation, reading operation and erasing operation for the rewritable non-volatile memory module 220 together with the data management circuit 212 under instruction of the processor 211 (or the storage status management circuit unit 215). For example, the reading operation for a storage unit of the rewritable non-volatile memory module 220 is performed using a specific read voltage based on instruction of the storage status management circuit unit 215.

For instance, the processor 211 can execute a write command sequence to instruct the memory interface control circuit 213 to write the data into the rewritable non-volatile memory module 220; the processor 211 can execute a read command sequence to instruct the memory interface control circuit 213 to read the data from one or more physical units (a.k.a. target physical units) corresponding to the read command in the rewritable non-volatile memory module 220; the processor 211 can execute an erase command sequence to instruct the memory interface control circuit 213 to perform the erasing operation for the rewritable non-volatile memory module 220. Each of the write command sequence, the read command sequence and the erase command sequence may include one or more program codes or command codes, which are configured to perform the corresponding writing, reading and erasing operations on the rewritable non-volatile memory module 220. In an embodiment, the processor 211 can further give other command sequences to the memory interface control circuit 213 so as to perform the corresponding operations for the rewritable non-volatile memory module 220.

In addition, data to be written to the rewritable non-volatile memory module 220 is converted into a format acceptable by the rewritable non-volatile memory module 220 through the memory interface control circuit 213. Specifically, when the processor 211 (or the storage status management circuit unit 215) intends to access the rewritable non-volatile memory module 220, the processor 211 (or the storage status management circuit unit 215) sends the corresponding command sequences to the memory interface control circuit 213 in order to instruct the memory interface control circuit 213 to perform the corresponding operations. For example, the command sequences may include the write command sequence as an instruction for writing data, the read command sequence as an instruction for reading data, the erase command sequence as an instruction for erasing data, and other corresponding command sequences as instructions for various memory operations (e.g., changing a plurality of default read voltage values of a default read voltage set for the reading operation or performing a garbage collection procedure). The command sequences may include one or more signals, or data from the bus. The signals or the data may include command codes and program codes. For example, information such as identification codes and memory addresses are included in the read command sequence.

The rewritable non-volatile memory module 220 is coupled to the storage controller 210 (the memory interface control circuit unit 213) and configured to store data written from the host system 10. The rewritable non-volatile memory module 220 may be a SLC (Single Level Cell) NAND flash memory module (i.e., a flash memory module capable of storing one bit in one memory cell), an MLC (Multi Level Cell) NAND flash memory module (i.e., a flash memory module capable of storing two bits in one memory cell), a TLC (Triple Level Cell) NAND flash memory module (i.e., a flash memory module capable of storing three bits in one memory cell), a QLC (Quadruple Level Cell) NAND flash memory module (i.e., a flash memory module capable of storing four bits in one memory cell), a 3D NAND flash memory module or a vertical NAND flash memory module, or other flash memory modules or any other memory module having the same characteristics. The memory cells in the rewritable non-volatile memory module 220 are disposed in an array.

In this embodiment, the rewritable non-volatile memory module 220 has a plurality of word lines, wherein each word line among the word lines includes a plurality of memory cells. The memory cells on the same word line constitute one or more physical programming units (physical pages). In addition, a plurality of physical programming units may constitute one physical unit (a physical block or a physical erasing unit). In this embodiment, one physical programming unit may include the physical pages of different types. For instance, in an embodiment, for the TLC NAND flash memory module, one physical programming unit of the TLC NAND flash memory module may include a first type physical page, a second type physical page and a third type physical page. The first type physical page is, for example, a lower physical page storing one bit value; the second type physical page is, for example, a middle physical page storing one bit value; and the third type physical page is, for example, a middle physical page storing one bit value. In general, when data is to be written into the upper, middle and lower physical pages of the TLC NAND flash memory module, the data is written into the lower physical page, the middle physical page, and the upper physical page in that sequence. In other words, according to a written order, among the physical pages of the same physical programming unit, the first one being written with data is the first type physical page, the second one being written with data is the second type physical page, the third one being written with data is the third type physical page, and so on.

In this embodiment, the physical erasing unit is a minimum unit for erasing (i.e., each erasing physical unit includes a minimum number of memory cells to be erased together). Each of the physical erasing units has a plurality of physical programming units. One physical erasing unit may refer to a combination of any number of the physical programming units, depending on practical requirements.

In the following embodiments, for example, one physical block is used as one physical erasing unit (a.k.a. the physical unit), and each physical programming unit is regarded as one physical sub-unit. Further, it should be understood that, when the processor 211 groups the physical programming units (or the physical units) in the rewritable non-volatile memory module 220 for the corresponding management operations, the physical programming units (or the physical units) are logically grouped and their actual locations are not changed.

For descriptive convenience, in the following embodiments, one physical programming unit is regarded as one storage unit. Also, in the following embodiments, the storage status identifying operation and the memory management method being used are described using one physical programming unit as an example.

The storage controller 210 assigns a plurality of logical units for the rewritable non-volatile memory module 220. The host system 10 accesses user data stored in a plurality of physical units through the assigned logical units. Here, each of the logical units may be composed of one or more logical addresses. For example, the logical unit may be a logical block, a logical page, or a logical sector. In this embodiment, the logical unit is a logical block, and the logical sub-unit is a logical page. Each logical unit includes a plurality of logical sub-units. One logical unit may be mapped to one physical unit, and one logical sub-unit may be mapped to one physical sub-unit.

For instance, the storage controller 210 would create a logical to physical address mapping table and a physical to logical address mapping table for recording a mapping relation between the logical units (e.g., the logical blocks, the logical pages or the logical sectors) assigned to the rewritable non-volatile memory module 220 and the physical units (e.g., the physical erasing units, the physical programming units or the physical sectors). In other words, the storage controller 210 can look up for the physical unit mapped to one logical unit by using the logical to physical address mapping table, and the storage controller 210 can look up for the logical unit mapped to one physical unit by using the physical to logical address mapping table. Nonetheless, the technical concept for the mapping relation between the logical units and the physical units is a well-known technical means in the field, which is not repeated hereinafter.

In this embodiment, the error checking and correcting circuit 214 is coupled to the processor 211 and configured to execute an error checking and correcting procedure to ensure correctness of data. Specifically, when the processor 211 receives the write command from the host system 10, the error checking and correcting circuit 214 generates an ECC (error correcting code) and/or an EDC (error detecting code) for data corresponding to the write command, and the processor 211 writes data corresponding to the write command and the corresponding ECC and/or the EDC into the rewritable non-volatile memory module 220. Then, when the processor 211 reads the data from the rewritable non-volatile memory module 220, the ECC and/or the EDC corresponding to the data are also read, and the error checking and correcting circuit 214 performs the error checking and correcting procedure on the read data based on the ECC and/or the EDC. In addition, after the error checking and correcting procedure is completed, if the read data is successfully decoded, the error checking and correcting circuit 214 can return an error bit value (a.k.a. the number of error bits) to the processor 211.

In an embodiment, the storage controller 210 further includes a buffer memory 216 and a power management circuit 217. The buffer memory is coupled to the processor 211 and configured to temporarily store data and commands from the host system 10; data from the rewritable non-volatile memory module 220 or other system data for managing the storage device 20 so the processor 211 can rapidly access the data, the command or the system data from the buffer memory 216. The power management circuit 217 is coupled to the processor 211 and configured to control power of the storage device 20.

In this embodiment, the storage status management circuit unit 215 includes a Gray Code count circuit 2151 and a storage status determination circuit 2152. The storage status management circuit unit 215 is a circuit assembly unit (hardware) for performing the storage status identifying operation. Operations performed by each part of the storage status management circuit unit 215 may also be considered as operations performed by the storage status management circuit unit 215. The storage status management circuit unit 215 may also be used to record information regarding a storage pattern for each storage unit (e.g., information like the storage patterns and a total capacity of all the storage units) and information for recording a relationship between a bit value ratio and the storage patterns corresponding to different memory types of the rewritable non-volatile memory module 220 (e.g., a bit value ratio-to-storage pattern table). The said storage unit may be the word line, the physical programming unit or the physical erasing unit. Nonetheless, for descriptive convenience, the memory management method and the storage controller of the disclosure are described using the physical programming unit as the storage unit in the following embodiments.

Details regarding how the storage status management circuit unit 215 performs the storage status identifying operation as well as functions of the Gray Code count circuit 2151 and the storage status determination circuit 2152 would be described below with reference to the accompanied drawings.

Figure 2:
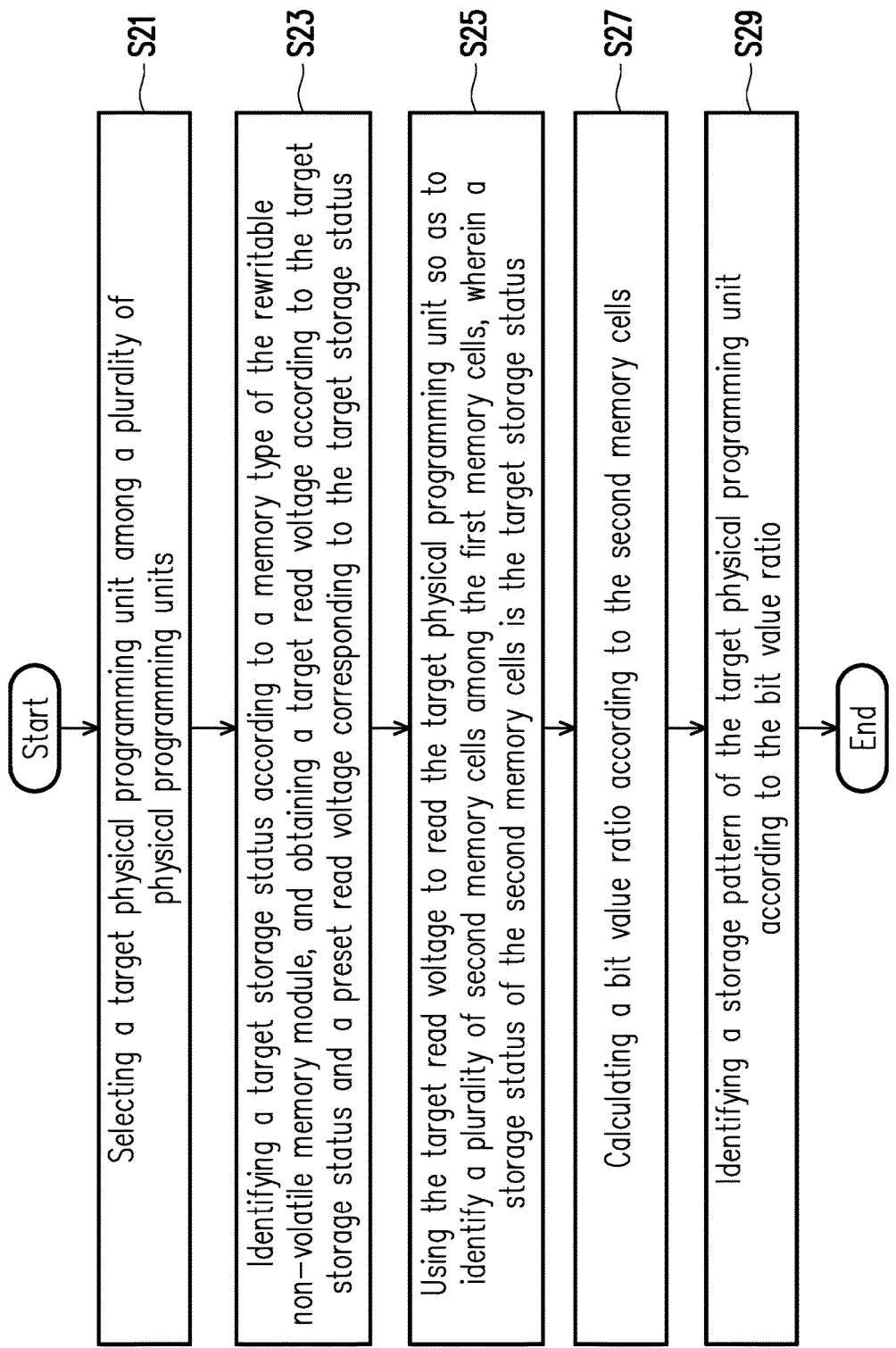
FIG. 2 is a flowchart illustrating a memory management method according to an embodiment of the disclosure.

FIG. 2 is a flowchart illustrating a memory management method according to an embodiment of the disclosure. It should be noted that, the memory management method illustrated in FIG. 2 may also be referred to as a storage status identifying method. Referring to FIG. 1 and FIG. 2 together, in step S21, the processor 211 selects a target physical programming unit among a plurality of physical programming units of a rewritable non-volatile memory module. All the memory cells included by the target physical programming unit may also be referred to as first memory cells.

Specifically, the processor 211 can select one physical programming unit (a.k.a. the target physical programming unit) among the physical programming units of the rewritable non-volatile memory module 220 at a particular timepoint, and instruct the storage status management circuit unit 215 to perform the storage status identifying operation on the target physical programming unit. For instance, the particular timepoint includes: (1) when the storage device 20 is idle (i.e., when the storage device 20 is idle for more than a predetermined time threshold); (2) when the storage device is powered on; (3) when a restoring operation corresponding to a sudden power outage event is performed.

The processor 211 (or the storage status management circuit unit 215) can perform the storage status identifying operation on each physical programming unit among the physical programming units with the storage status not yet confirmed. Here, the physical programming unit selected for the storage status identifying operation is the target physical programming unit. In another embodiment, the processor 211 (or the storage status management circuit unit 215) can select a different physical programming unit from all the physical programming units of the rewritable non-volatile memory module 220 as the target physical programming unit to perform the storage status identifying operation.

In addition, the processor 211 (or the storage status management circuit unit 215) can also directly perform the storage status identifying operation on all the physical programming units in an open physical erasing unit (i.e., the physical erasing unit or the physical block currently used to store the written data).

After the target physical programming unit is selected, the method proceeds to step S23, in which the storage status management circuit unit 215 identifies a target storage status according to a memory type of the rewritable non-volatile memory module, and obtains a target read voltage according to the target storage status and a preset read voltage corresponding to the target storage status.

Specifically, the target physical programming unit is composed of a plurality of the first memory cells (a.k.a. target memory cells). Each memory cell is programmed to store a bit value corresponding to one of different Gray Codes (a.k.a. storage statuses), and a total of the Gray Codes is N, where N is a first predetermined positive integer greater than 2. In correspondence to a different type of NAND flash memory modules (different memory type) used by the rewritable non-volatile memory module 220, a value of N may vary. For example, if the rewritable non-volatile memory module 220 is the SLC NAND flash memory module, N is equal to 2; if the rewritable non-volatile memory module 220 is the MLC NAND flash memory module, N is equal to 4; if the rewritable non-volatile memory module 220 is the TLC NAND flash memory module, N is equal to 8; if the rewritable non-volatile memory module 220 is the QLC NAND flash memory module, N is equal to 16; and so on. In other words, the value of N and the corresponding storage statuses are determined according to the memory type of the rewritable non-volatile memory module 220.

In this embodiment, the step of identifying the target storage status according to the memory type of the rewritable non-volatile memory module includes: identifying a plurality of storage statuses arranged by a first order according to the memory type of the rewritable non-volatile memory module by the storage status management circuit unit 215 (the Gray Code count circuit 2151); and the storage status management circuit unit 215 (the Gray Code count circuit 2151) uses the storage status arranged at a first place among the plurality of storage statuses as the target storage status.

In this embodiment, the step of obtaining the target read voltage according to the target storage status and the preset read voltage corresponding to the target storage status includes: identifying a read voltage set corresponding to the memory type according to the memory type of the rewritable non-volatile memory module, wherein the read voltage set has a plurality of read voltages arranged by the first order; using the read voltage arranged at a first place in the read voltages as the preset read voltage, and obtaining the target read voltage by adjusting the preset read voltage. How the target storage status and the corresponding target read voltage are identified in correspondence to the different memory type is described below with reference to FIGS. 3A, 4A and 5A.

Further, it should also be noted that, in the following embodiments, data stored in the target physical programming unit have all underwent a scrambling procedure (e.g., by a scrambler) so as to be stored into the target physical programming unit uniformly according to the different data bit value (i.e., the total number of the data bits stored in the target physical programming unit is similar in the different storage statuses). Also, when the target read voltage is used to read the target physical programming unit, raw data (data that has not been subjected to an anti-scrambling procedure and a decoding procedure) stored in the target physical programming unit would be directly read.

Figure 3A:
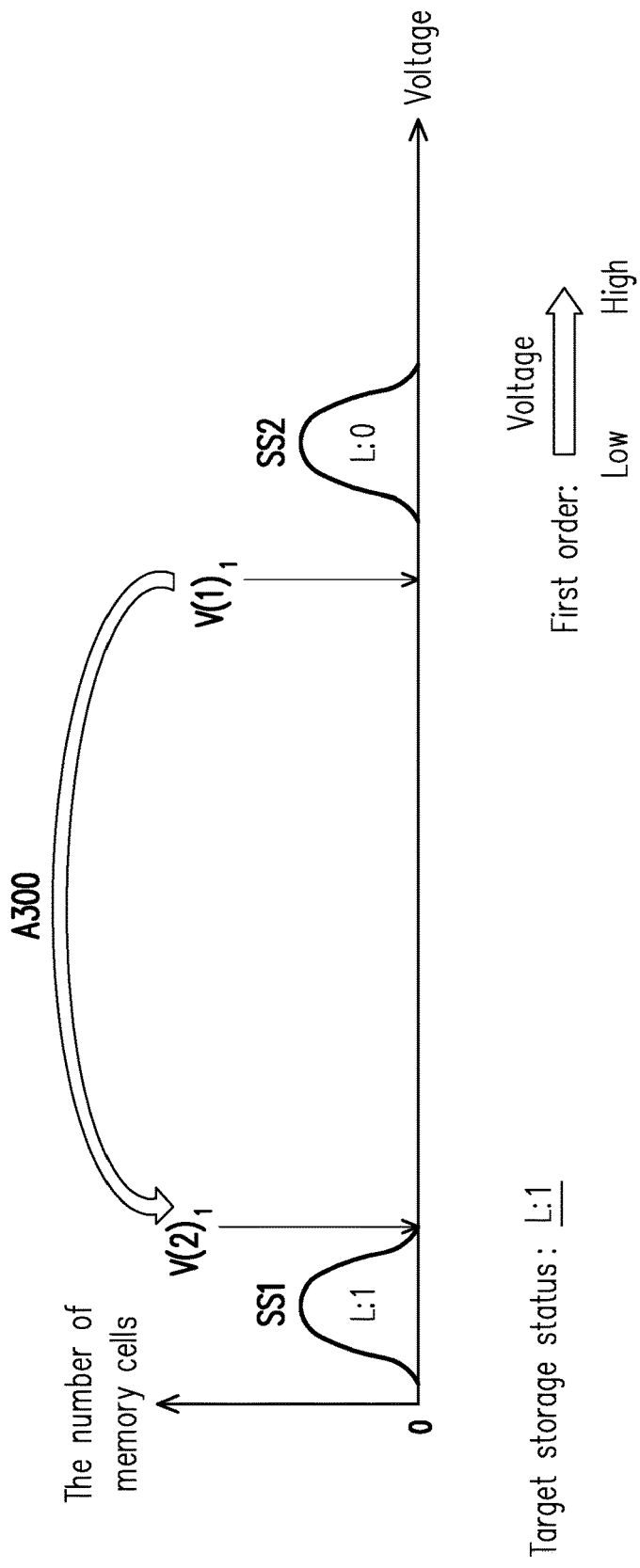
FIG. 3A is a schematic diagram illustrating a target storage status of a plurality of memory cells corresponding to a SLC NAND flash memory module and a corresponding target read voltage according to an embodiment of the disclosure.
Figure 4A:
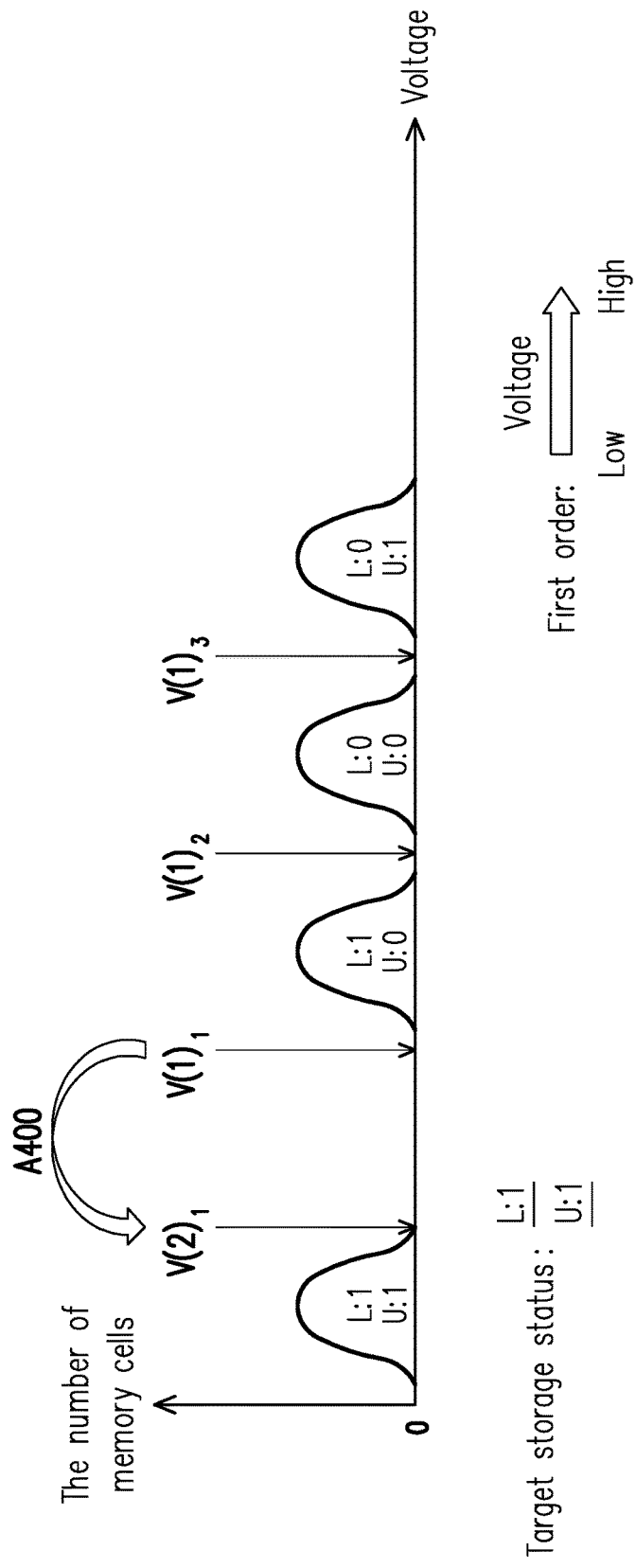
FIG. 4A is a schematic diagram illustrating a target storage status of a plurality of memory cells corresponding to an MLC NAND flash memory module and a corresponding target read voltage according to an embodiment of the disclosure.
Figure 5A:
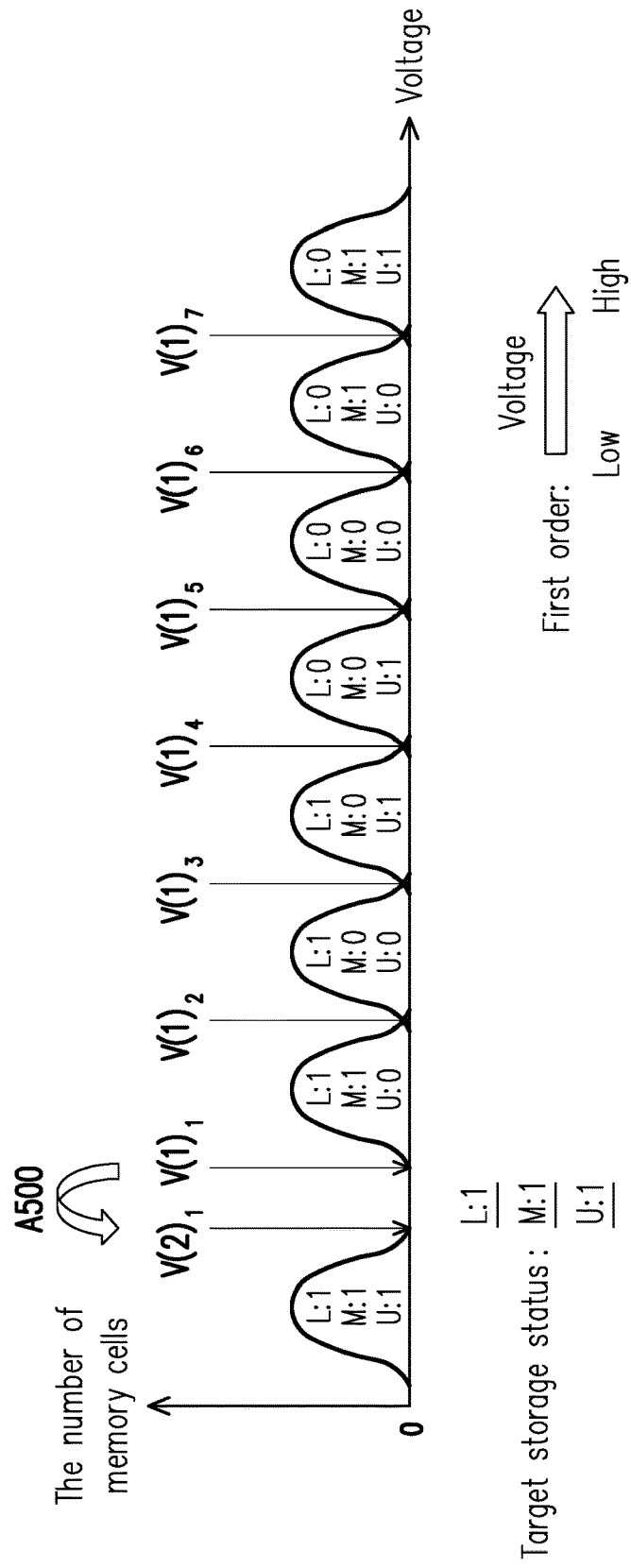
FIG. 5A is a schematic diagram illustrating a target storage status of a plurality of memory cells corresponding to a TLC NAND flash memory module and a corresponding target read voltage according to an embodiment of the disclosure.

FIG. 3A is a schematic diagram illustrating a target storage status of a plurality of memory cells corresponding to a SLC NAND flash memory module and a corresponding target read voltage according to an embodiment of the disclosure. FIG. 4A is a schematic diagram illustrating a target storage status of a plurality of memory cells corresponding to an MLC NAND flash memory module and a corresponding target read voltage according to an embodiment of the disclosure. FIG. 5A is a schematic diagram illustrating a target storage status of a plurality of memory cells corresponding to a TLC NAND flash memory module and a corresponding target read voltage according to an embodiment of the disclosure.

With reference to FIG. 3A, the physical programming unit of the SLC NAND flash memory module (abbr. the SLC) has one physical page (a.k.a. a lower page L), which may include two storage statuses (Gray Codes) arranged by the first order (e.g., the bit value "1" and the bit value "0"). The first order is an order from low to high based on the voltage values of the threshold voltage distribution. If the target physical programming unit of the SLC is being programmed with data, the first memory cells of the target physical programming unit would be uniformly programmed to include the storage statuses "1" and "0" (each with a ratio of approximately 50% (100%/2=50%)).

Further, the processor 211 (or the storage status management circuit unit 215) can use a read voltage $V(1)_1$ corresponding to the two storage statuses to read the target physical programming unit of the SLC (i.e., use the read voltage $V(1)_1$ to read one of the plurality of physical programming units of the rewritable non-volatile memory module 220 of the SLC), so as to identify the storage status included by the plurality of target memory cells of the target physical programming unit (i.e., identify the bit value being written into the plurality of target memory cells). The plurality of memory cells in the SLC programmed by the bit value "1" (a mark "L:1" in FIG. 3A) has a threshold voltage distribution SS1, which is lower than the read voltage $V(1)_1$; the plurality of memory cells in the SLC programmed by the bit value "0" (i.e., "L:0") has a threshold voltage distribution SS2, which is greater than the read voltage $V(1)_1$. The storage status management circuit unit 215 (e.g., the Gray Code count circuit 2151) identifies the read voltage set (which includes the read voltage V(1)) corresponding to the SLC according to the memory type of the SLC, and uses the read voltage arranged at the first place in the read voltage set as the preset read voltage.

In this example, the storage status management circuit unit 215 (e.g., the Gray Code count circuit 2151) uses the storage status arranged at the first place (e.g., the storage status indicated by "L:1", i.e., the storage status "1") as the target storage status. In addition, the storage status management circuit unit 215 (e.g., the Gray Code count circuit 2151) further adjusts the preset read voltage $V(1)_1$ into the target read voltage $V(2)_1$ (e.g., as shown by an arrow A300). The target read voltage is also the read voltage used for identifying the target storage status.

The method for adjusting the preset read voltage into the target read voltage is described as follows. Specifically, the Gray Code count circuit 2151 would first identify the preset read voltage as described above, and a voltage value of the target read voltage may be obtained by adding a "negative" offset voltage to the preset read voltage (the voltage value of the target read voltage may also be obtained by subtracting one "positive" offset voltage from the preset read voltage). In general, the preset read voltage may use a voltage regulation command to instruct using a plurality of offset voltages (which may be negative or positive values) to adjust the voltage value of the preset read voltage so as to obtain the target read voltage. In this embodiment, the target read voltage may use the voltage regulation command to adjust the preset read voltage towards the leftmost (e.g., as shown by the arrow A300 depicted in FIG. 3A) so as to adjust the preset read voltage $V(1)_1$ into the target read voltage $V(2)_1$ (e.g., the preset read voltage may be added by a lowest negative offset voltage to become the target read voltage). The offset voltage may be predetermined according to the memory type. In another embodiment, the target read voltage may also be predetermined corresponding to the memory type (i.e., rather than being adjusted by using the preset read voltage).

In other words, in this embodiment, the step of obtaining the target read voltage by adjusting the preset read voltage includes: identifying a voltage adjustment range corresponding to the preset read voltage, wherein the voltage adjustment range covers the preset read voltage; and adjusting the preset read voltage into the target read voltage according to the voltage adjustment range, wherein the target read voltage is a minimum voltage value in the voltage adjustment range. For example, if the preset read voltage is 0.5 mV, the voltage adjustment range is from 0.1 mV to 0.9 mV. The Gray Code count circuit 2151 adjusts the preset read voltage from 0.5 mV to 0.1 mV according to the voltage adjustment range (i.e., the target read voltage 0.1 mV is obtained). The voltage adjustment range may be predetermined according to the memory type.

With reference to FIG. 4A, compared to the SLC, the physical programming unit of the MLC NAND flash memory module (abbr. the MLC) may include a lower physical page (which may be marked by "L") (a.k.a. the first type physical page) and an upper physical page (which may be marked by "U") (a.k.a. the second type physical page), wherein each of the upper and lower physical pages may store two storage statuses (i.e., "1", "0"). Therefore, the MLC may include four storage statuses (Gray Codes) arranged by the first order, including: the bit value "11" (e.g., "L:1 U:1" in FIG. 4A, i.e., the storage status of the lower physical page is "1" and the storage status of the upper physical page is "1"); the bit value "10" (e.g., "L:1 U:0" in FIG. 4A, i.e., the storage status of the lower physical page is "1" and the storage status of the upper physical page is "0"); the bit value "00" (e.g., "L:0 U:0" in FIG. 4A, i.e., the storage status of the lower physical page is "0" and the storage status of the upper physical page is "0"); and the bit value "01" (e.g., "L:0 U:1" in FIG. 4A, i.e., the storage status of the lower physical page is "0" and the storage status of the upper physical page is "1"). If the target physical programming unit of the MLC is being programmed with data, the plurality of first memory cells of the target physical programming unit would be uniformly programmed to include the storage statuses "11", "10", "00" and "01" (each with a ratio of approximately 25% (100%/4=25%)).

In addition, the storage status management circuit unit 215 (e.g., the Gray Code count circuit 2151) identifies a read voltage set corresponding to the MLC according to the memory type of the MLC, which includes a plurality of read voltages $V(1)_1$ to $V(1)_3$ arranged by the first order. The processor 211 (or the storage status management circuit unit 215) may use the read voltages $V(1)_1$ to $V(1)_3$ of the read voltage set corresponding to the four storage statuses of the MLC to read to the target physical programming unit of the MLC, so as to identify the storage status/the threshold voltage distribution included by the plurality of first memory cells of the target physical programming unit.

In this example, based on the plurality of read voltages in the read voltage set corresponding to the MLC, the storage status management circuit unit 215 (e.g., the Gray Code count circuit 2151) uses the read voltage $V(1)_1$ arranged at the first place in the read voltage set as the preset read voltage. In addition, based on the plurality of storage statuses corresponding to the MLC, the storage status management circuit unit 215 (e.g., the Gray Code count circuit 2151) uses the storage status arranged at the first place (e.g., the storage status indicated by "L:1 U:1", i.e., the storage status "11") as the target storage status. The storage status management circuit unit 215 (e.g., the Gray Code count circuit 2151) further adjusts the preset read voltage $V(1)_1$ into the target read voltage $V(2)_1$ (e.g., as shown by an arrow A400).

For instance, the read voltage $V(1)_2$ is used to identify/distinguish the storage status of the memory cells of the lower physical page. For instance, the storage status of the memory cells of the lower physical page with the threshold voltage distribution lower than the read voltage $V(1)_2$ (e.g., threshold voltage distributions MS1 and MS2) is "1" (e.g., "L:1" in FIG. 4A); the storage status of the memory cells of the lower physical page with the threshold voltage distribution greater than the read voltage $V(1)_2$ (e.g., threshold voltage distributions MS3 and MS4) is "0" (e.g., "L:0" in FIG. 4A). The read voltages $V(1)_1$ and $V(1)_3$ are used to identify/distinguish the storage status of the memory cells of the upper physical page. For instance, the storage status of the memory cells of the upper physical page with the threshold voltage distribution lower than the read voltage $V(1)_1$ (e.g., the threshold voltage distribution MS1) is "1" (e.g., "U:1" in FIG. 4A); the storage status of the memory cells of the upper physical page with the threshold voltage distribution greater than the read voltage $V(1)_3$ (e.g., the threshold voltage distribution MS4) is "1" (e.g., "U:1" in FIG. 4A); the storage status of the memory cells of the upper physical page with the threshold voltage distribution between the read voltages $V(1)_1$ and $V(1)_3$ (e.g., the threshold voltage distributions MS2 and MS3) is "0" ("U:0" in FIG. 4A). In other words, the read voltages $V(1)_1$ to $V(1)_3$ may be used to identify: the bit value of the storage status of the memory cells of the threshold voltage distribution MS1 being "11"; the bit value of the storage status of the memory cells of the threshold voltage distribution MS2 being "10"; the bit value of the storage status of the memory cells of the threshold voltage distribution MS3 being "00"; the bit value of the storage status of the memory cells of the threshold voltage distribution MS4 being "01".

With reference to FIG. 5A, as similar to the SLC and the MLC, the physical programming unit of the TLC NAND flash memory module (abbr. the TLC) may include a lower physical page (which may be marked by "L") (a.k.a. the first type physical page), a middle physical page (which may be marked by "M") (a.k.a. the second type physical page), and an upper physical page (which may be marked by "U") (a.k.a. the third type physical page), wherein each of the upper, middle and lower physical pages may store two storage statuses (i.e., "1", "0"). Accordingly, the physical programming unit of the TLC may include eight storage statuses arranged by the first order (e.g., storage status combinations of the upper, middle, lower physical pages "111", "110", "100", "101", "001", "000", "010" and "011" as depicted in FIG. 5A). If the target physical programming unit of the TLC is being programmed with data, the plurality of first memory cells of the target physical programming unit would be uniformly programmed to include the storage statuses "111", "110", "100", "101", "001", "000", "010" and "011" (each with a ratio of approximately 12.5% (100%/8=12.5%)).

In addition, the storage status management circuit unit 215 (e.g., the Gray Code count circuit 2151) identifies a read voltage set corresponding to the TLC according to the memory type of the TLC, which includes a plurality of read voltages $V(1)_1$ to $V(1)_7$ arranged by the first order. The processor 211 (or the storage status management circuit unit 215) may use the read voltages $V(1)_1$ to $V(1)_7$ of the read voltage set corresponding to the eight storage statuses of the TLC to read to the target physical programming unit of the TLC, so as to identify the storage status/the threshold voltage distribution included by the plurality of first memory cells of the target physical programming unit. Here, the read voltage $V(1)_4$ is used to identify/distinguish the storage status of the lower physical page; the read voltage $V(1)_2$ and the read voltage $V(1)_6$ are used to identify/distinguish the storage status of the middle physical page; the read voltage $V(1)_1$, the read voltage $V(1)_3$, the read voltage $V(1)_5$ and the read voltage $V(1)_7$ are used to identify/distinguish the storage status of the upper physical page.

In this example, based on the plurality of read voltages in the read voltage set corresponding to the TLC, the storage status management circuit unit 215 (e.g., the Gray Code count circuit 2151) uses the read voltage $V(1)_1$ arranged at the first place in the read voltage set as the preset read voltage. In addition, based on the storage statuses corresponding to the TLC, the storage status management circuit unit 215 (e.g., the Gray Code count circuit 2151) uses the storage status arranged at the first place (e.g., the storage status indicated by "L:1 M:1 U:1", i.e., the storage status "111") as the target storage status. The storage status management circuit unit 215 (e.g., the Gray Code count circuit 2151) further adjusts the preset read voltage $V(1)_1$ into the target read voltage $V(2)_1$ (e.g., as shown by an arrow A500).

Referring back to FIG. 2, in step S25, the storage status management circuit unit 215 (e.g., the Gray Code count circuit 2151) uses the target read voltage to read the target physical programming unit so as to identify a plurality of second memory cells among the plurality of first memory cells, wherein a storage status of the second memory cells is the target storage status. In other words, the storage status management circuit unit 215 (e.g., the Gray Code count circuit 2151) can use the obtained target read voltage to read the target physical programming unit so as to identify the second memory cells with the target storage status and a plurality of third memory cells with the storage status not being the target storage status (i.e., the storage status of the plurality of third memory cells is different from the target storage status) from all the first memory cells. It should be noted that, a threshold voltage distribution of the plurality of second memory cells is lower than a threshold voltage distribution of the plurality of third memory cells among the plurality of first memory cells. For instance, with reference to FIG. 3A, the threshold voltage distribution SS1 (corresponding to the target storage status "1") of the second memory cells identified by using the target read voltage $V(2)_1$ is lower than the threshold voltage distribution SS2 (corresponding to the target storage status "0") of the third memory cells.

Next, in step S27, the storage status management circuit unit 215 (e.g., the Gray Code count circuit 2151) is configured to calculate a bit value ratio according to the plurality of the second memory cells.

Figure 3B:
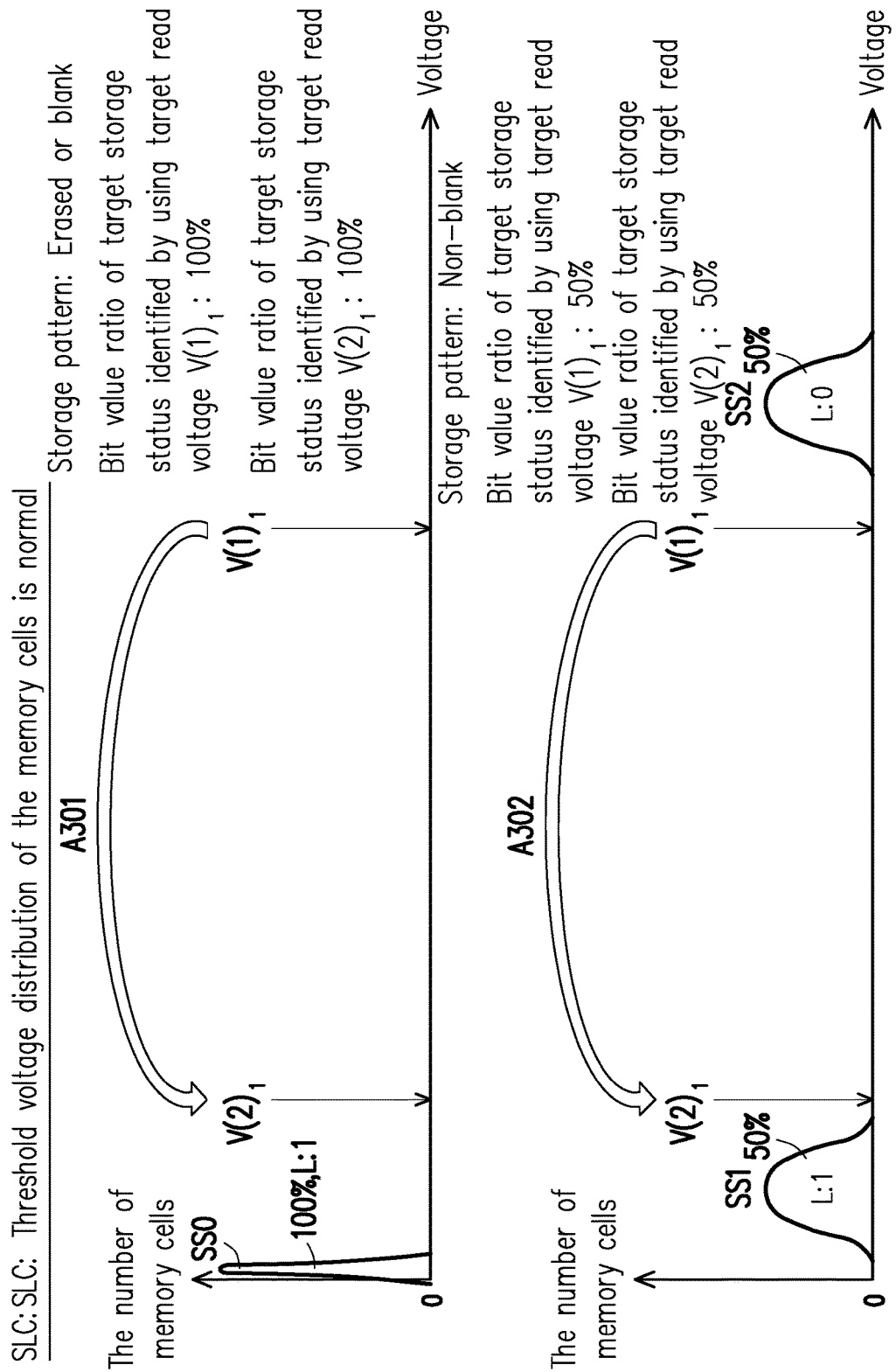
FIG. 3B is a schematic diagram illustrating a storage status identifying operation for the SLC NAND flash memory module according to an embodiment of the disclosure.

FIG. 3B is a schematic diagram illustrating a storage status identifying operation for the SLC NAND flash memory module according to an embodiment of the disclosure.

With reference to the example on the upper half of FIG. 3B, it is assumed that the target physical programming unit of the SLC is not programmed with data yet (i.e., the storage pattern of the target physical programming unit is "erased" or "blank"), a threshold voltage distribution SS0 of all the first memory cells of the target physical program fining unit would be around the voltage 0V, and has the storage status being "1". In other words, a total amount of the memory cells having the storage status being "1" (a.k.a. the second memory cells) in the target physical programming unit occupies 100% of a total amount of all the first memory cells in the target physical programming unit (e.g., the example illustrated on the upper half of FIG. 3B), i.e., the storage status of all the first memory cells is "1". A ratio (specific value) may be obtained by dividing the total amount of the second memory cells having the storage status being "1" obtained by using the target read voltage $V(2)_1$ by the total amount of all the first memory cells, and such ratio may also be referred to as the bit value ratio. The bit value ratio is used to represent a ratio of the second memory cells having the identified storage status being "1" to all the first memory cells of the target physical programming unit after the target read voltage is used to read the target physical programming unit. The target read voltage $V(2)_1$ is the read voltage adjusted from the preset read voltage $V(1)_1$ (as shown by an arrow A301). It should be noted that under normal circumstances, the bit value ratio obtained by using the target read voltage to read a blank physical programming unit (100%) is equal to the bit value ratio obtained by using the preset read voltage (100%).

It is worth noting that, based on the above definition, the bit value ratio of the physical programming unit of the SLC with the storage pattern being erased or blank is equal to 100%. Similarly, the bit value ratio of the physical programming unit of the MLC/TLC or the QLC with the storage pattern being erased or blank is also equal to 100%.

With reference to the example on the lower half of FIG. 3B, it is assumed that the target physical programming unit of the SLC is programmed with data (i.e., the storage pattern of the target physical programming unit is "non-blank"), the target memory cells of the target physical programming unit are uniformly programmed to include the storage statuses of "1" and "0" (each with the ratio of approximately 50%). Among the threshold voltage distributions SS1 and SS2 corresponding to the different storage statuses, the threshold voltage distribution SS1 is one that corresponds to the target storage status "1". In this example, the storage status management circuit unit 215 (e.g., the Gray Code count circuit 2151) can adjust the preset read voltage $V(1)_1$ into the target read voltage $V(2)_1$ (as shown by an arrow A302). Next, the storage status management circuit unit 215 (e.g., the Gray Code count circuit 2151) can use the target read voltage $V(2)_1$ to read the target physical programming unit, and identify the plurality of the second memory cells corresponding to the target storage status "1" as well as their quantity. Next, the storage status management circuit unit 215 (e.g., the Gray Code count circuit 2151) can calculate a result indicating that the total amount of the second memory cells having "the storage status being "1"" in the target physical programming unit occupies 50% of the total amount of all the first memory cells in the target physical programming unit according to the total amount of the second memory cells and the total amount of all the first memory cells as well as a result indicating that a total amount of the third memory cells having the storage status being "0" in the target physical programming unit also occupies the remaining 50% of the total amount of all the first memory cells in the target physical programming unit. In this example, the bit value ratio of the target storage status identified by using the target read voltage $V(2)_1$ is equal to 50%; and the bit value ratio of the target storage status identified by using the preset read voltage $V(1)_1$ is equal to 50%.

In this embodiment, the Gray Code count circuit 2151 of the storage status management circuit unit 215 may be used to calculate the total amount of the memory cells corresponding to the storage status for each read voltage and count the total amount of the memory cells having different bit values. Further, the Gray Code count circuit 2151 may also be used to calculate the bit value ratio corresponding to each target read voltage.

The spirit of the storage status identifying method provided by the disclosure is that, the adjusted target read voltage is directly used to read the target physical programming unit so as to obtain the corresponding bit value ratio. Accordingly, the storage pattern of the target physical programming unit may be determined according to the obtained bit value ratio. The benefit of such method is that, the storage status identifying method provided by the disclosure can avoid misjudgment on the storage status when the threshold voltage distribution of the memory cells of the target physical programming unit written (programmed) with data has an abnormal offset. The following description is provided with reference to FIG. 3C.

Figure 3C:
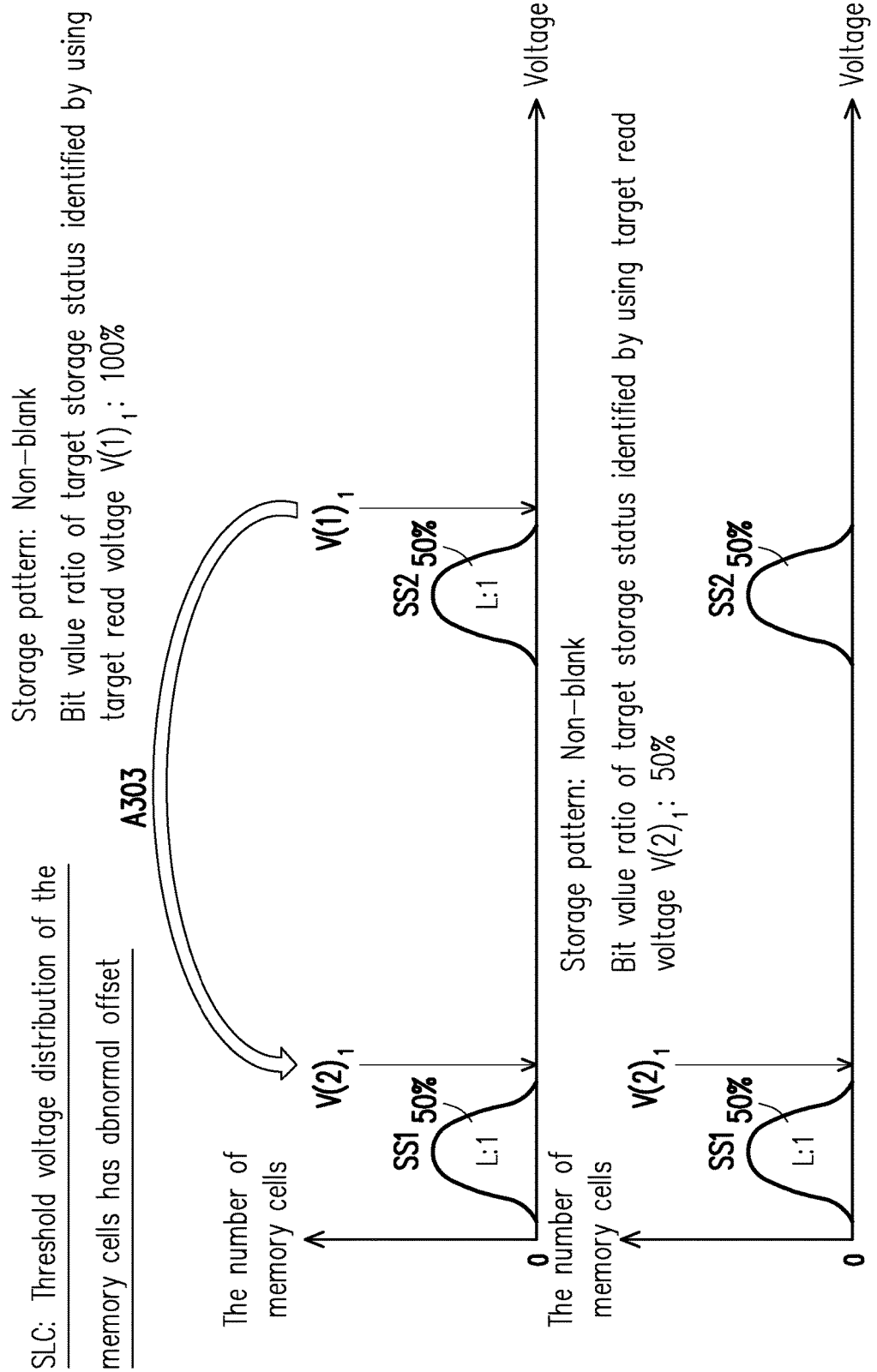
FIG. 3C is a schematic diagram illustrating the storage status identifying operation for the SLC NAND flash memory module according to an embodiment of the disclosure.

FIG. 3C is a schematic diagram illustrating the storage status identifying operation for the SLC NAND flash memory module according to an embodiment of the disclosure.

With reference to FIG. 3C, it is assumed that, the rewritable non-volatile memory module 220 is the SLC, and the target physical programming unit of the SLC is programmed with data (i.e., the storage pattern of the target physical programming unit is non-blank). Among the threshold voltage distributions SS1 and SS2 corresponding to the different storage statuses, the threshold voltage distribution SS1 is one that corresponds to the target storage status "1". In addition, it is further assumed that the threshold voltage distribution has the abnormal offset (the threshold voltage distribution SS2 shifts to the left). In this example, due to the abnormal offset of the threshold voltage distribution, the bit value ratio obtained by using the preset read voltage $V(1)_1$ to read the target physical programming unit is 100%, which is different from the bit value ratio (50%) of the preset read voltage $V(1)$ in the example on the lower half of FIG. 3B (the normal threshold voltage distribution of the memory cells written with data) but identical to the bit value ratio (100%) in the example (blank/erased, i.e., not written with data) on the upper half of FIG. 3B. In other words, if the storage pattern of the target physical programming unit is determined simply according to bit value ratio of the preset read voltage without the preset read voltage being adjusted, the storage pattern of the target physical programming unit having the abnormal threshold voltage distribution would be determined as blank (even though the physical programming unit is actually non-blank), causing an identification result of the storage pattern of the storage unit to be wrong.

However, according to the storage status identifying operation/method of the embodiment, the storage status management circuit unit 215 (e.g., the Gray Code count circuit 2151) would adjust the preset read voltage $V(1)_1$ into the target read voltage $V(2)_1$ (as shown by an arrow A303). Then, as shown by the example on the lower half of FIG. 3C, the storage status management circuit unit 215 (e.g., the Gray Code count circuit 2151) can use the target read voltage $V(2)_1$ to read the target physical programming unit, and identify the second memory cells corresponding to the threshold voltage distribution SS1 as well as their quantity. Next, the storage status management circuit unit 215 (e.g., the Gray Code count circuit 2151) can calculate a result indicating that the total amount of the second memory cells having "the storage status being the target storage status "1"" in the target physical programming unit occupies 50% of the total amount of all the first memory cells in the target physical programming unit according to the total amount of the second memory cells and the total amount of all the first memory cells. That is, in this example, the bit value ratio of the target storage status identified by using the target read voltage $V(2)_1$ is equal to 50%.

In other words, the storage status identifying method/operation provided by the embodiment can obtain the bit value ratio corresponding to the target read voltage more accurately by using the target read voltage.

Figure 4B:
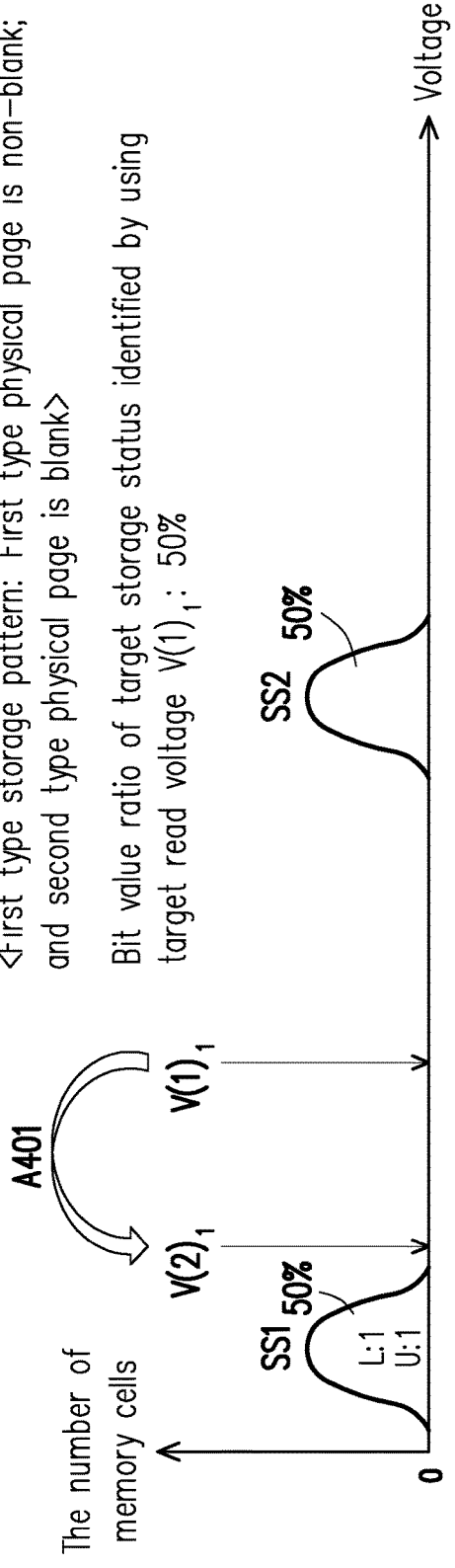
FIG. 4B is a schematic diagram illustrating a storage status identifying operation for the MLC NAND flash memory module according to an embodiment of the disclosure.
Figure 4C:
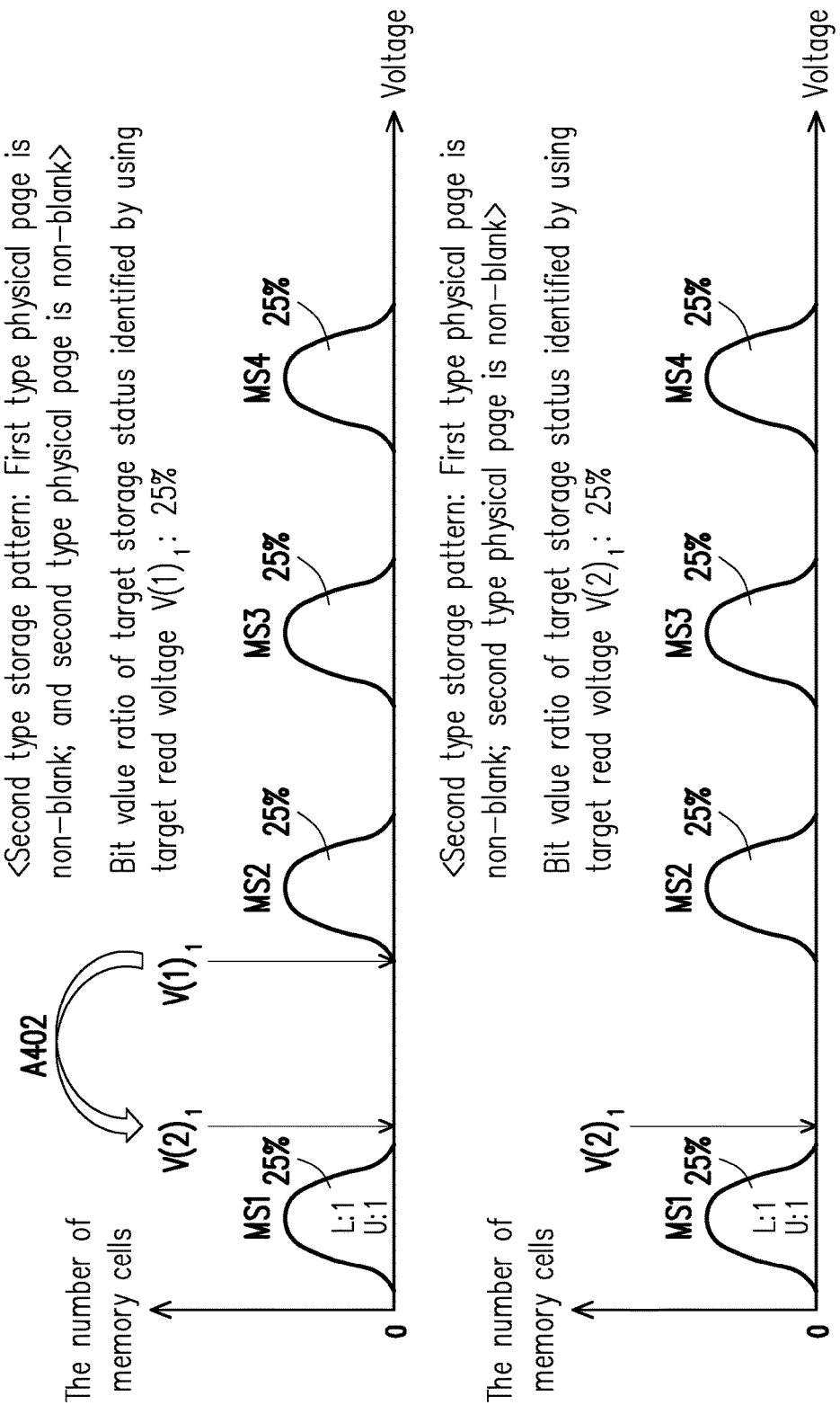
FIG. 4C is a schematic diagram illustrating the storage status identifying operation for the MLC NAND flash memory module according to an embodiment of the disclosure.
Figure 4D:
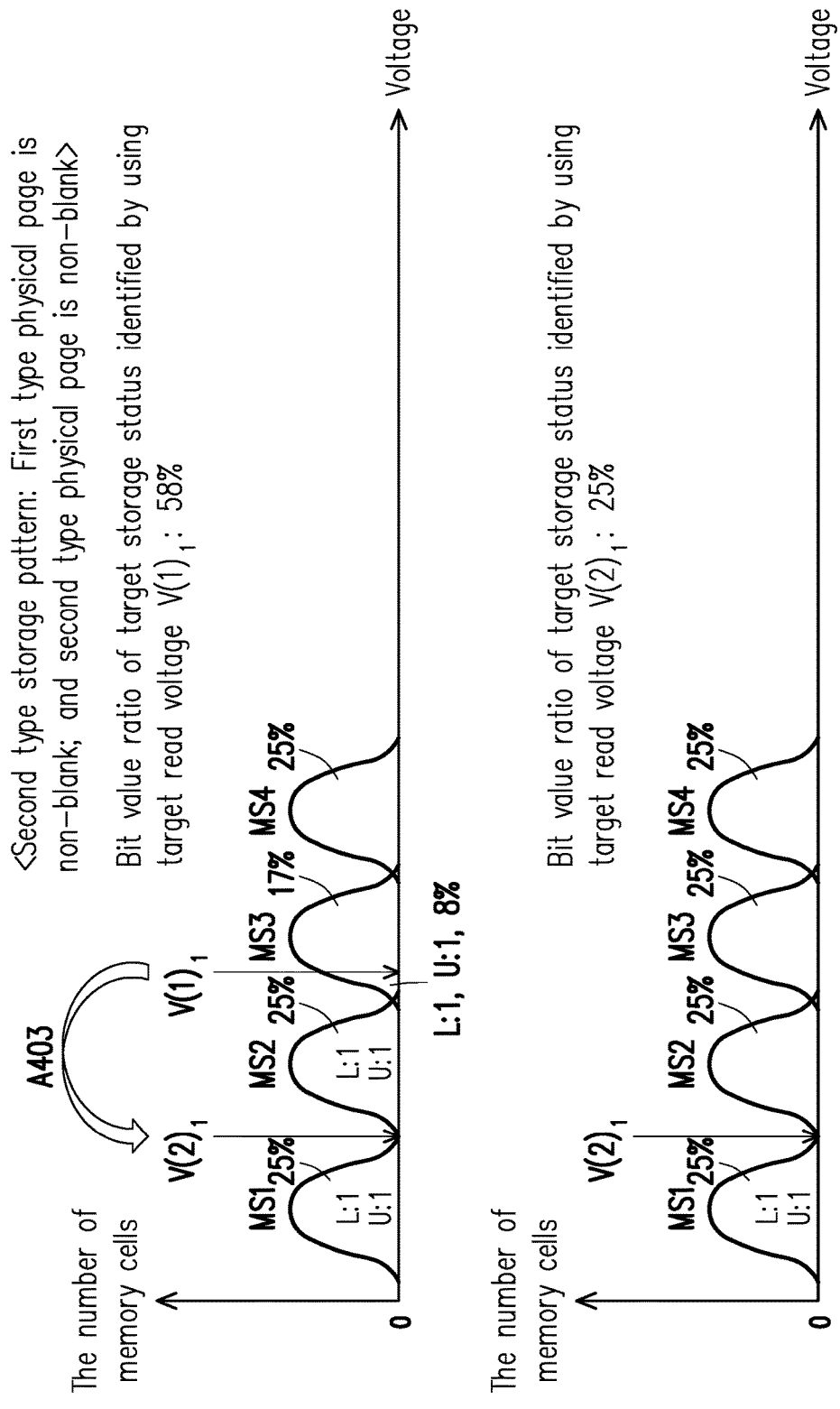
FIG. 4D is a schematic diagram illustrating the storage status identifying operation for the MLC NAND flash memory module according to an embodiment of the disclosure.

FIG. 4D is a schematic diagram illustrating the storage status identifying operation for the MLC NAND flash memory module according to an embodiment of the disclosure.

With reference to FIG. 4D, it is assumed that, the rewritable non-volatile memory module 220 is the MLC, and the first type physical page and the second type physical page of the target physical programming unit of the MLC is programmed with data (i.e., the storage pattern of the target physical programming unit is a second type storage pattern). Among the threshold voltage distributions MS1, MS2, MS3 and MS4 corresponding to the different storage statuses, the threshold voltage distribution MS1 is one that corresponds to the target storage status "11". In addition, it is further assumed that the threshold voltage distribution has the abnormal offset (the threshold voltage distributions MS2 to MS4 shifts to the left). In this example, due to the abnormal offset of the threshold voltage distribution, the bit value ratio obtained by using the preset read voltage $V(1)_1$ to read the target physical programming unit is 58%, which is different from the bit value ratio (25%) of the preset read voltage $V(1)_1$ in the example of FIG. 4A (the normal threshold voltage distribution of the memory cells written with data). In other words, in this example, the bit value ratio obtained by using the preset read voltage $V(1)_1$ is wrong.

However, according to the storage status identifying operation/method, the storage status management circuit unit 215 (e.g., the Gray Code count circuit 2151) would adjust the preset read voltage $V(1)_1$ into the target read voltage $V(2)_1$ (as shown by an arrow A403). Then, as shown by the example on the lower half of FIG. 4D, the storage status management circuit unit 215 (e.g., the Gray Code count circuit 2151) can use the target read voltage $V(2)_1$ to read the target physical programming unit, and identify the plurality of the second memory cells corresponding to the target storage status "11" as well as their quantity. Next, the storage status management circuit unit 215 (e.g., the Gray Code count circuit 2151) can calculate a result indicating that the total amount of the second memory cells having "the storage status being the target storage status "11"" in the target physical programming unit occupies 25% of the total amount of all the first memory cells in the target physical programming unit according to the total amount of the second memory cells and the total amount of all the first memory cells. That is, the bit value ratio of the target storage status identified by using the target read voltage $V(2)_1$ is equal to 25% (identical to the bit value ratio obtained when the threshold voltage distribution is normal).

Description regarding how to calculate the bit value ratio is further described using the MLC NAND flash memory module again as an example.

FIG. 4B is a schematic diagram illustrating a storage status identifying operation for the MLC NAND flash memory module according to an embodiment of the disclosure.

With reference to the example on the upper half of FIG. 4B, it is assumed that the first type physical page of the target physical programming unit of the MLC is programmed with data (i.e., the storage pattern of the target physical programming unit is a first type storage pattern). Among the threshold voltage distributions SS1 and SS2 corresponding to the different storage statuses, the threshold voltage distribution SS1 is one that corresponds to the target storage status "11". In this example, the storage status management circuit unit 215 (e.g., the Gray Code count circuit 2151) can adjust the preset read voltage $V(1)_1$ into the target read voltage $V(2)_1$ (as shown by an arrow A401).

Next, with reference to the example on the lower half of FIG. 4B, the storage status management circuit unit 215 (e.g., the Gray Code count circuit 2151) can use the target read voltage $V(2)_1$ to read the target physical programming unit, and identify the plurality of the second memory cells corresponding to the target storage status "11" as well as their quantity. Next, the storage status management circuit unit 215 (e.g., the Gray Code count circuit 2151) can calculate a result indicating that the total amount of the second memory cells having "the storage status being "11"" in the target physical programming unit occupies 50% of the total amount of all the first memory cells in the target physical programming unit according to the total amount of the second memory cells and the total amount of all the first memory cells (the number of the second memory cells having the threshold voltage distribution SS1 on the left of the target read voltage $V(2)_1$ is 50% of the number of all the first memory cells). Further, the storage status management circuit unit 215 (e.g., the Gray Code count circuit 2151) can also identify that the total amount of the third memory cells having the storage status not being "11" in the target physical programming unit occupies the remaining 50% of all the first memory cells in the target physical programming unit. In this example, the bit value ratio of the target storage status identified by using the target read voltage $V(2)_1$ is equal to 50%; and the bit value ratio of the target storage status identified by using the preset read voltage $V(1)_1$ is equal to 50%.

FIG. 4C is a schematic diagram illustrating the storage status identifying operation for the MLC NAND flash memory module according to an embodiment of the disclosure.

With reference to the example on the upper half of FIG. 4C, it is assumed that the first type physical page and the second type physical page of the target physical programming unit of the MLC is programmed with data (i.e., the storage pattern of the target physical programming unit is the second type storage pattern). Among the threshold voltage distributions MS1, MS2, MS3 and MS4 corresponding to the different storage statuses, the threshold voltage distribution MS1 is one that corresponds to the target storage status "11". In this example, the storage status management circuit unit 215 (e.g., the Gray Code count circuit 2151) can adjust the preset read voltage $V(1)_1$ into the target read voltage $V(2)_1$ (as shown by an arrow A402).

Next, with reference to the example on the lower half of FIG. 4C, the storage status management circuit unit 215 (e.g., the Gray Code count circuit 2151) can use the target read voltage $V(2)_1$ to read the target physical programming unit, and identify the second memory cells corresponding to the target storage status "11" as well as their quantity. Next, the storage status management circuit unit 215 (e.g., the Gray Code count circuit 2151) can calculate a result indicating that the total amount of the second memory cells having "the storage status being "11"" in the target physical programming unit occupies 25% of the total amount of all the first memory cells in the target physical programming unit according to the total amount of the second memory cells and the total amount of all the first memory cells (the number of the plurality of the second memory cells having the threshold voltage distribution MS1 on the left of the target read voltage $V(2)_1$ is 25% of the number of all the first memory cells). Further, the storage status management circuit unit 215 (e.g., the Gray Code count circuit 2151) can also identify that the total amount of the third memory cells having the storage status not being "11" in the target physical programming unit occupies the remaining 75% of all the first memory cells in the target physical programming unit. In this example, the bit value ratio of the target storage status identified by using the target read voltage $V(2)_1$ is equal to 25%; and the bit value ratio of the target storage status identified by using the preset read voltage $V(1)_1$ is equal to 25%.

Figure 5B:
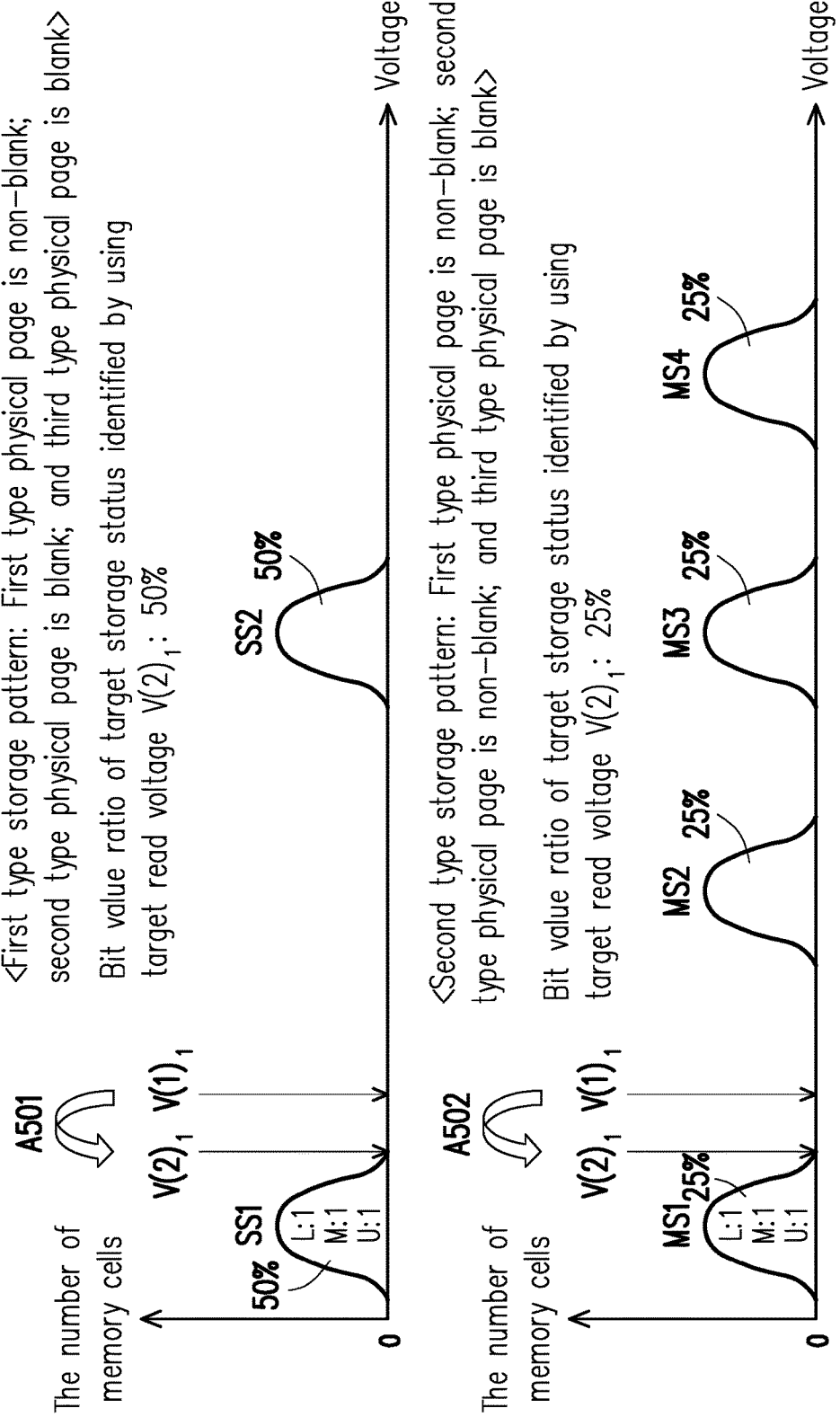
FIG. 5B is a schematic diagram illustrating a storage status identifying operation for the TLC NAND flash memory module according to an embodiment of the disclosure.

FIG. 5B is a schematic diagram illustrating a storage status identifying operation for the TLC NAND flash memory module according to an embodiment of the disclosure.

With reference to the example on the upper half of FIG. 5B, it is assumed that the first type physical page of the target physical programming unit of the TLC is programmed with data (i.e., the storage pattern of the target physical programming unit is the first type storage pattern). Among the threshold voltage distributions SS1 and SS2 corresponding to the different storage statuses, the threshold voltage distribution SS1 is one that corresponds to the target storage status "111". In this example, the storage status management circuit unit 215 (e.g., the Gray Code count circuit 2151) can adjust the preset read voltage $V(1)_1$ into the target read voltage $V(2)_1$ (as shown by an arrow A501).

Next, the storage status management circuit unit 215 (e.g., the Gray Code count circuit 2151) can use the target read voltage $V(2)_1$ to read the target physical programming unit, and identify the plurality of the second memory cells corresponding to the target storage status "111" as well as their quantity. Next, the storage status management circuit unit 215 (e.g., the Gray Code count circuit 2151) can calculate a result indicating that the total amount of the second memory cells having "the storage status being "111"" in the target physical programming unit occupies 50% of the total amount of all the first memory cells in the target physical programming unit according to the total amount of the second memory cells and the total amount of all the first memory cells (the number of the second memory cells having the threshold voltage distribution SS1 on the left of the target read voltage $V(2)_1$ is 50% of the number of all the first memory cells). Further, the storage status management circuit unit 215 (e.g., the Gray Code count circuit 2151) can also identify that the total amount of the third memory cells having the storage status not being "111" in the target physical programming unit occupies the remaining 50% of all the first memory cells in the target physical programming unit. In this example, the bit value ratio of the target storage status identified by using the target read voltage $V(2)_1$ is equal to 50%.

As another example, with reference to the example on the lower half of FIG. 5B, it is assumed that the first type physical page and the second type physical page of the target physical programming unit of the TLC is programmed with data (i.e., the storage pattern of the target physical programming unit is the second type storage pattern). Among the threshold voltage distributions MS1, MS2, MS3 and MS4 corresponding to the different storage statuses, the threshold voltage distribution MS1 is one that corresponds to the target storage status "111". In this example, the storage status management circuit unit 215 (e.g., the Gray Code count circuit 2151) can adjust the preset read voltage V(1)$_1$ into the target read voltage V(2)$_1$ (as shown by an arrow A502).

Next, the storage status management circuit unit 215 (e.g., the Gray Code count circuit 2151) can use the target read voltage V(2)$_1$ to read the target physical programming unit, and identify the plurality of second memory cells corresponding to the target storage status "111" as well as their quantity. Next, the storage status management circuit unit 215 (e.g., the Gray Code count circuit 2151) can calculate a result indicating that the total amount of the plurality of the second memory cells having "the storage status being "111"" in the target physical programming unit occupies 25% of the total amount of all the first memory cells in the target physical programming unit according to the total amount of the second memory cells and the total amount of all the first memory cells (the number of the plurality of second memory cells having the threshold voltage distribution MS1 on the left of the target read voltage V(2)$_1$ is 25% of the number of all the first memory cells). Further, the storage status management circuit unit 215 (e.g., the Gray Code count circuit 2151) can also identify that the total amount of the plurality of third memory cells having the storage status not being "111" in the target physical programming unit occupies the remaining 75% of all the first memory cells in the target physical programming unit. In this example, the bit value ratio of the target storage status identified by using the target read voltage V(2)$_1$ is equal to 25%.

Figure 5C:
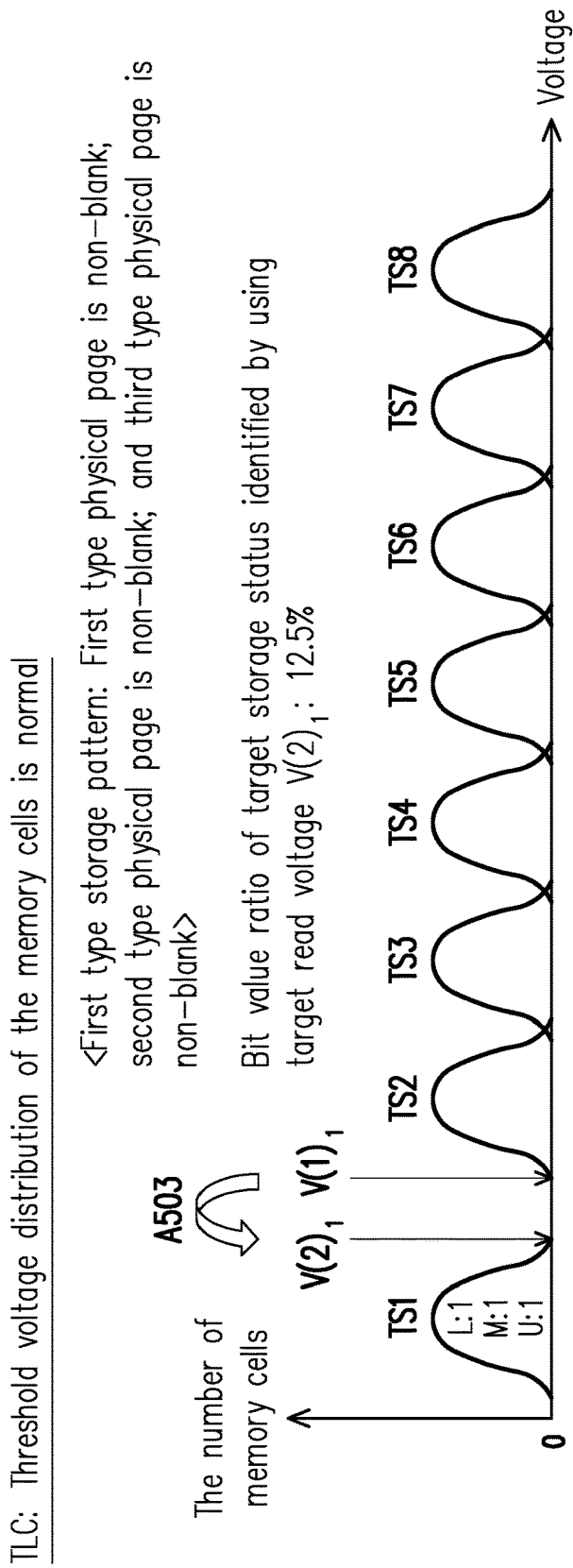
FIG. 5C is a schematic diagram illustrating the storage status identifying operation for the TLC NAND flash memory module according to an embodiment of the disclosure.

FIG. 5C is a schematic diagram illustrating the storage status identifying operation for the TLC NAND flash memory module according to an embodiment of the disclosure.

With reference to FIG. 5C, it is assumed that the first type physical page, the second type physical page and the third type physical page of the target physical programming unit of the TLC is programmed with data (i.e., the storage pattern of the target physical programming unit is a third type storage pattern). Among threshold voltage distributions TS1 to TS8 corresponding to the different storage statuses, the threshold voltage distribution TS1 is one that corresponds to the target storage status "111". In this example, the storage status management circuit unit 215 (e.g., the Gray Code count circuit 2151) can adjust the preset read voltage V(1)$_1$ into the target read voltage V(2)$_1$ (as shown by an arrow A503).

Next, the storage status management circuit unit 215 (e.g., the Gray Code count circuit 2151) can use the target read voltage V(2)$_1$ to read the target physical programming unit, and identify the plurality of second memory cells corresponding to the target storage status "111" as well as their quantity. Next, the storage status management circuit unit 215 (e.g., the Gray Code count circuit 2151) can calculate a result indicating that the total amount of the plurality of second memory cells having "the storage status being "111"" in the target physical programming unit occupies 12.5% of the total amount of all the first memory cells in the target physical programming unit according to the total amount of the plurality of second memory cells and the total amount of all the first memory cells (the number of the plurality of second memory cells having the threshold voltage distribution TS1 on the left of the target read voltage V(2)$_1$ is 12.5% of the number of all the first memory cells). Further, the storage status management circuit unit 215 (e.g., the Gray Code count circuit 2151) can also identify that the total amount of the plurality of third memory cells having the storage status not being "111" in the target physical programming unit occupies the remaining 87.5% of all the first memory cells in the target physical programming unit. In this example, the bit value ratio of the target storage status identified by using the target read voltage V(2)$_1$ is equal to 12.5%.

Referring back to FIG. 2, after the bit value ratio corresponding to the target storage status is calculated, the method proceeds to step S29, in which the storage status management circuit unit 215 (e.g., the storage status determination circuit 2152) is configured to identify the storage pattern of the target physical programming unit according to the bit value ratio.

Specifically, the step of identifying the storage pattern of the target physical programming unit according to the bit value ratio includes: determining whether the bit value ratio is within a blank standard bit value ratio range; in response to the bit value ratio within the blank standard bit value ratio range, determining that the target physical programming unit is blank; and in response to the bit value ratio not within the blank standard bit value ratio range, determining that the target physical programming unit is non-blank.

For instance, according to the description for the example on the upper half of FIG. 3B, it can be known that, if the bit value corresponding to the target storage status is 100%, the storage status management circuit unit 215 (e.g., the storage status determination circuit 2152) can directly determine that the target physical programming unit is blank. Therefore, in this embodiment, the storage status management circuit unit 215 (e.g., the storage status determination circuit 2152) pre-records one blank standard bit value ratio range (e.g., 100% to (100−x) %), which is used to define a bit value ratio range for determining whether the storage unit is blank. Here, x is 0 or an extremely small positive value (e.g., less than 2). In other words, in response to the bit value ratio obtained by using the target read voltage that falls within the blank standard bit value ratio range (e.g., 100% to 98%, i.e., x is 2), the storage status management circuit unit 215 (e.g., the storage status determination circuit 2152) can determine that the selected target physical programming unit is blank.

Otherwise, in response to the bit value ratio obtained by using the target read voltage that does not fall within the blank standard bit value ratio range (e.g., 100% to 98%, i.e., x is 2), the storage status management circuit unit 215 (e.g., the storage status determination circuit 2152) can determine that the selected target physical programming unit is non-blank (stored with data). Moreover, in this embodiment, the storage status management circuit unit 215 (e.g., the storage status determination circuit 2152) further identifies one or more standard bit value ratio ranges according to the memory type of the rewritable non-volatile memory module, and compares the bit value ratio with said one or more standard bit value ratio ranges. Said one or more standard bit value ratio ranges respectively correspond to one or more storage patterns being "stored with data" of the memory type of the rewritable non-volatile memory module. Next, in response to the bit value ratio that falls within a first standard bit value ratio range among the plurality of standard bit value ratio ranges, the storage pattern of the target physical programming unit is determined as the first type storage pattern corresponding to the first standard bit value ratio range among the storage patterns.

For instance, in view of the examples in FIGS. 3A, 3B, 3C, 4B and 5B, it can be known that, in response to the bit value ratio obtained by using the target read voltage to read the target physical programming unit being 50%, the storage status management circuit unit 215 (e.g., the storage status determination circuit 2152) can directly determine that only the first type physical page in the target physical programming unit is being written, i.e., the first type storage pattern; in response to the bit value ratio obtained by using the target read voltage to read the target physical programming unit being 25%, the storage status management circuit unit 215 (e.g., the storage status determination circuit 2152) can directly determine that only the first type physical page and the second type physical page in the target physical programming unit are being written, i.e., the second type storage pattern; in response to the bit value ratio obtained by using the target read voltage to read the target physical programming unit being 12.5%, the storage status management circuit unit 215 (e.g., the storage status determination circuit 2152) can directly determine that the first type physical page, the second type physical page and the third type physical page in the target physical programming unit are all being written, i.e., the third type storage pattern. In this way, by going through the above process (S21 to S29), the storage status management circuit unit 215 can rapidly and accurately determine the storage pattern of the target physical programming unit and thereby identify the number of the physical pages written with data in the target physical programming unit so the subsequent application related to a storage space usage (e.g., a data merging operation, a wear leveling operation or a garbage collection operation) may be performed.

FIG. 6 is a schematic diagram illustrating a relationship between a bit value ratio and a storage pattern according to an embodiment of the disclosure.

With reference to FIG. 6, based on the facts as described above, the storage status determination circuit 2152 can correspondingly set/record different standard bit value ratios respectively corresponding to different storage patterns in advance. For instance, the storage status determination circuit 2152 can pre-store one table 600, which is used to record a relationship between the bit value ratios and the storage patterns. The relationship includes, for example, the standard bit value corresponding to the first type storage pattern being "50%"; the standard bit value corresponding to the second type storage pattern being "25%"; the standard bit value corresponding to the third type storage pattern being "12.5%". More specifically, an association between the storage pattern bit value ratio and the corresponding storage pattern is that, if the corresponding storage pattern is an M-th type storage pattern (the target physical programming unit has M physical pages stored with data), the corresponding standard bit value ratio is $(100/2^M)\%$.

Further, in an embodiment, the storage status determination circuit 2152 can correspondingly set different standard bit value ratio ranges respectively corresponding to different storage patterns. The standard bit value ratio ranges are calculated based on the standard bit value ratio of the corresponding storage pattern added by positive and negative error. The margin of said error can be set according to the corresponding storage pattern (e.g., a %, b %, c % and d % depicted in FIG. 6).

Accordingly, after obtaining the bit value ratio by using the target read voltage to read the target physical programming unit, the storage status determination circuit 2152 can then determine whether the bit value ratio falls within the plurality of standard bit value ratio ranges. If the bit value ratio falls within one standard bit value ratio range among the plurality of standard bit value ratio ranges (a.k.a. the first standard bit value ratio range), the storage status determination circuit 2152 can directly determine that the target physical programming unit has the storage pattern corresponding to the first standard bit value ratio range (a.k.a. a first storage pattern).

It should be noted that, the physical programming unit of the QLC may have four physical pages of different types. Therefore, the QLC may have four storage patterns, i.e., the first type storage pattern, the second type storage pattern, the third type storage pattern and a fourth type storage pattern.

It is worth noting that, in the foregoing embodiments, the bit value ratio refers to the ratio of the second memory cells corresponding to the storage status being "1", and the standard bit value ratio, the standard bit value ratio range, and the blank bit value ratio range are also correspondingly designed based on this spirit. However, the disclosure is not limited in this regard. For example, in another embodiment, the storage status management circuit unit 215 can use the ratio of the memory cells corresponding to the storage status being "0" as "the bit value ratio", and the standard bit value ratio, the standard bit value ratio range, and the blank bit value ratio range are also designed correspondingly. Basically, the standard bit value ratio, the standard bit value ratio range and the blank bit value ratio range designed under the circumstance where "the bit value ratio refers to the ratio of the memory cells corresponding to the storage status being "0"" and the standard bit value ratio, the standard bit value ratio range and the blank bit value ratio range designed under the circumstance where "the bit value ratio refers to the ratio of the memory cells corresponding to the storage status being "1"" have a corresponding association (since the bit value storable by the physical page of one particular type can only be "1" or "0", and a sum of the respective ratios is 100%).

In summary, the memory management method and the storage controller provided by the invention can identify the target storage status of the corresponding target read voltage according to the memory type of the rewritable non-volatile memory module, and directly identify the storage pattern of the target physical programming unit through the bit value ratio obtained by using the target read voltage, so as to improve efficiency and accuracy for identifying the storage pattern of the target physical programming unit and thereby improve efficiency of the storage device for managing the used space and the unused space.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A memory management method, adapted to a storage device having a rewritable non-volatile memory module, wherein the rewritable non-volatile memory module comprises a plurality of physical programming units, wherein each physical programming unit among the physical programming units has a plurality of memory cells, and the method comprises:

selecting a target physical programming unit among the physical programming units, wherein the target physical programming unit has a plurality of first memory cells;

identifying a target storage status according to a memory type of the rewritable non-volatile memory module, and obtaining a target read voltage according to the target storage status and a preset read voltage corresponding to the target storage status;

using the target read voltage to read the target physical programming unit so as to identify a plurality of second memory cells among the first memory cells, wherein a storage status of the second memory cells is the target storage status, wherein a threshold voltage distribution of the second memory cells is lower than a threshold voltage distribution of a plurality of third memory cells among the first memory cells, wherein a storage status of the third memory cells is different from the target storage status;

calculating a bit value ratio according to the second memory cells; and identifying a storage pattern of the target physical programming unit according to the bit value ratio.

2. The memory management method of claim 1, wherein the step of identifying the target storage status according to the memory type of the rewritable non-volatile memory module comprises:

identifying a plurality of storage statuses arranged by a first order according to the memory type of the rewritable non-volatile memory module; and using the storage status arranged at a first place in the storage statuses as the target storage status, wherein the step of obtaining the target read voltage according to the target storage status and the preset read voltage corresponding to the target storage status comprises:

identifying a read voltage set corresponding to the memory type according to the memory type of the rewritable non-volatile memory module, wherein the read voltage set has a plurality of read voltages arranged by the first order;

using the read voltage arranged at a first place in the read voltages as the preset read voltage, and obtaining the target read voltage by adjusting the preset read voltage.

3. The memory management method of claim 2, wherein the step of obtaining the target read voltage by adjusting the preset read voltage comprises:

identifying a voltage adjustment range corresponding to the preset read voltage, wherein the voltage adjustment range covers the preset read voltage; and adjusting the preset read voltage into the target read voltage according to the voltage adjustment range, wherein the target read voltage is a minimum voltage value in the voltage adjustment range.

4. The memory management method of claim 1, wherein the step of identifying the storage pattern of the target physical programming unit according to the bit value ratio comprises:

determining whether the bit value ratio is within a blank standard bit value ratio range;

in response to the bit value ratio within the blank standard bit value ratio range, determining that the target physical programming unit is blank; and in response to the bit value ratio not within the blank standard bit value ratio range, determining that the target physical programming unit is non-blank.

5. The memory management method of claim 4, wherein if the bit value ratio is not within the blank standard bit value ratio range, the step of determining the storage pattern of the target physical programming unit according to the bit value ratio further comprises:

comparing the bit value ratio with a plurality of standard bit value ratio ranges, wherein the standard bit value ratio ranges respectively correspond to a plurality of storage patterns of the memory type of the rewritable non-volatile memory module; and in response to the bit value ratio that falls within a first standard bit value ratio range among the standard bit value ratio ranges, determining that the storage pattern of the target physical programming unit is a first storage pattern corresponding to the first standard bit value ratio range among the storage patterns.

6. A storage controller, configured to control a storage device having a rewritable non-volatile memory module, the storage controller comprising:

a connection interface circuit, configured to couple to a host system;

a memory interface control circuit, configured to couple to the rewritable non-volatile memory module, wherein the rewritable non-volatile memory module comprises a plurality of physical programming units, wherein each physical programming unit among the physical programming units has a plurality of memory cells;

a storage status management circuit unit; and a processor, coupled to the connection interface circuit, the memory interface control circuit and the storage status management circuit unit, wherein the processor selects a target physical programming unit among the physical programming units and instructs the storage status management circuit unit to perform a storage status identifying operation on the target physical programming unit, wherein the target physical programming unit has a plurality of first memory cells, in the storage status identifying operation, the storage status management circuit unit is configured to identify a target storage status according to a memory type of the rewritable non-volatile memory module and obtain a target read voltage according to the target storage status and a preset read voltage corresponding to the target storage status;

the storage status management circuit unit is further configured to use the target read voltage to read the target physical programming unit so as to identify a plurality of second memory cells among the first memory cells, wherein a storage status of the second memory cells is the target storage status, wherein a threshold voltage distribution of the second memory cells is lower than a threshold voltage distribution of a plurality of third memory cells among the first memory cells, wherein a storage status of the third memory cells is different from the target storage status;

the storage status management circuit unit is further configured to calculate a bit value ratio according to the second memory cells; and the storage status management circuit unit is further configured to identify a storage pattern of the target physical programming unit according to the bit value ratio.

7. The storage controller of claim 6, wherein in the operation where the storage status management circuit unit is configured to identify the target storage status according to the memory type of the rewritable non-volatile memory module, the storage status management circuit unit identifies a plurality of storage statuses arranged by a first order according to the memory type of the rewritable non-volatile memory module; and the storage status management circuit unit uses the storage status arranged at a first place in the storage statuses as the target storage status, wherein the step of obtaining the target read voltage according to the target storage status and the preset read voltage corresponding to the target storage status comprises:

the storage status management circuit unit identifies a read voltage set corresponding to the memory type according to the memory type of the rewritable non-volatile memory module, wherein the read voltage set has a plurality of read voltages arranged by the first order;

the storage status management circuit unit uses the read voltage arranged at a first place in the read voltages as the preset read voltage, and obtaining the target read voltage by adjusting the preset read voltage.

8. The storage controller of claim 7, wherein in the operation of obtaining the target read voltage by adjusting the preset read voltage, the storage status management circuit unit identifies a voltage adjustment range corresponding to the preset read voltage, wherein the voltage adjustment range covers the preset read voltage; and the storage status management circuit unit adjusts the preset read voltage into the target read voltage according to the voltage adjustment range, wherein the target read voltage is a minimum voltage value in the voltage adjustment range.

9. The storage controller of claim 6, wherein in the operation where the storage status management circuit unit is further configured to identify the storage pattern of the target physical programming unit according to the bit value ratio, the storage status management circuit unit determines whether the bit value ratio is within a blank standard bit value ratio range, wherein in response to the bit value ratio within the blank standard bit value ratio range, the storage status management circuit unit determines that the target physical programming unit is blank, wherein in response to the bit value ratio not within the blank standard bit value ratio range, the storage status management circuit unit determines that the target physical programming unit is non-blank.

10. The storage controller of claim 9, wherein if the bit value ratio is not within the blank standard bit value ratio range, in the operation where the storage status management circuit unit is further configured to determine the storage pattern of the target physical programming unit according to the bit value ratio, the storage status management circuit unit further compares the bit value ratio with a plurality of standard bit value ranges, wherein the standard bit value ratio ranges respectively correspond to a plurality of storage patterns of the memory type of the rewritable non-volatile memory module, in response to the bit value ratio that falls within a first standard bit value ratio range among the standard bit value ratio ranges, the storage status management circuit unit determines that the storage pattern of the target physical programming unit is a first storage pattern corresponding to the first standard bit value ratio range among the storage patterns.

* * * * *